(12) United States Patent
Lee et al.

(10) Patent No.: US 12,075,687 B2
(45) Date of Patent: Aug. 27, 2024

(54) MASK AND MASK ASSEMBLY

(71) Applicant: Samsung Display Co., Ltd., Yongin-si (KR)

(72) Inventors: Sangshin Lee, Yongin-si (KR); Sanghoon Kim, Hwaseong-si (KR); Seil Kim, Hwaseong-si (KR); Hong-Kyun Ahn, Hwaseong-si (KR); Jongsung Park, Hwaseong-si (KR); Seungjin Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 254 days.

(21) Appl. No.: 17/446,437

(22) Filed: Aug. 30, 2021

(65) Prior Publication Data

US 2022/0199905 A1 Jun. 23, 2022

(30) Foreign Application Priority Data

Dec. 23, 2020 (KR) .......... 10-2020-0182580

(51) Int. Cl.
*H10K 71/16* (2023.01)
*C23C 14/04* (2006.01)
*H10K 59/12* (2023.01)
*H10K 71/00* (2023.01)
*H10K 71/10* (2023.01)

(52) U.S. Cl.
CPC ......... *H10K 71/166* (2023.02); *C23C 14/042* (2013.01); *H10K 59/12* (2023.02); *H10K 71/00* (2023.02); *H10K 71/164* (2023.02); *H10K 71/191* (2023.02)

(58) Field of Classification Search
CPC .... H10K 71/166; H10K 71/00; H10K 71/191; H10K 71/164; H10K 59/12; C23C 14/042
See application file for complete search history.

(56) References Cited

U.S. PATENT DOCUMENTS

| | | | |
|---|---|---|---|
| 8,545,631 B2 | 10/2013 | Kim et al. | |
| 9,627,618 B2 | 4/2017 | Jeong | |
| 9,705,082 B2 | 7/2017 | Lee et al. | |
| 9,847,484 B2 | 12/2017 | Kim et al. | |
| 2014/0319484 A1* | 10/2014 | Kwon | H10K 50/813 257/40 |
| 2020/0208250 A1* | 7/2020 | Kim | C23C 14/14 |

FOREIGN PATENT DOCUMENTS

| | | |
|---|---|---|
| CN | 106169535 A | 11/2016 |
| KR | 10-0796617 B1 | 1/2008 |
| KR | 10-2016-0136492 A | 11/2016 |
| KR | 10-2084712 B1 | 3/2020 |

* cited by examiner

*Primary Examiner* — Timor Karimy
(74) *Attorney, Agent, or Firm* — Lewis Roca Rothgerber Christie LLP

(57) ABSTRACT

A mask includes: a body portion including a cell area, and a peripheral area surrounding the cell area, the body portion having a plurality of cell openings defined therein; and a plurality of mark patterns at the peripheral area. The cell area includes: a first area; and a second area adjacent to the first area, and the plurality of cell openings includes: first cell openings defined at the first area, and spaced from each other; and second cell openings defined at the second area, and spaced from each other. Each of the mark patterns includes at least one recess portion, and has a point-symmetrical shape with respect to a corresponding symmetry point.

15 Claims, 29 Drawing Sheets

MASK AND MASK ASSEMBLY

CROSS-REFERENCE TO RELATED APPLICATION

This application claims priority to and the benefit of Korean Patent Application No. 10-2020-0182580, filed on Dec. 23, 2020, in the Korean Intellectual Property Office, the entire content of which is incorporated by reference herein.

BACKGROUND

1. Field

Aspects of embodiments of the present disclosure relate to a mask, a mask assembly, and a method of manufacturing a display panel. More particularly, aspects of embodiments of the present disclosure relate to a mask, a mask assembly, and a method of manufacturing a display panel, which are capable of reducing a manufacturing cost of the display panel.

2. Description of the Related Art

A display device includes various electronic components, such as a display panel for displaying an image, an input sensing member for sensing an external input, and an electronic module. The display panel includes a light emitting element for generating light. The electronic module includes a camera, an infrared ray sensor, a proximity sensor, or the like.

The display panel includes a plurality of pixels. Each pixel includes a driving element, such as a transistor, and a display element, such as an organic light emitting diode. The electronic module is disposed under the display panel. The electronic module overlaps with an arrangement of the pixels in an area of the display panel.

The display element is formed by stacking an electrode and a light emitting pattern on a substrate. The light emitting pattern is patterned by a deposition process using a mask.

The above information disclosed in this Background section is for enhancement of understanding of the background of the present disclosure, and therefore, it may contain information that does not constitute prior art.

SUMMARY

A light emitting pattern of a display panel is patterned by a deposition process using a mask through which openings are defined. When the substrate is misaligned with the mask during the deposition process, process errors may occur. Accordingly, it may be desired to accurately align the substrate with the mask.

One or more embodiments of the present disclosure are directed to a mask capable of correcting an alignment with a substrate, and reducing a manufacturing cost.

One or more embodiments of the present disclosure are directed to a mask assembly including the mask, and a method of manufacturing a display panel using the mask assembly. Accordingly, reliability of a display panel that is manufactured using the mask assembly may be improved.

According to one or more embodiments of the present disclosure, a mask includes: a body portion including a cell area, and a peripheral area surrounding the cell area, the body portion having a plurality of cell openings defined therein; and a plurality of mark patterns at the peripheral area. The cell area includes: a first area; and a second area adjacent to the first area, and the plurality of cell openings includes: first cell openings defined at the first area, and spaced from each other; and second cell openings defined at the second area, and spaced from each other. Each of the mark patterns includes at least one recess portion, and has a point-symmetrical shape with respect to a corresponding symmetry point.

In an embodiment, the recess portion may be recessed from an upper surface or a lower surface of the body portion.

In an embodiment, the mark patterns may be connected to each other.

In an embodiment, the recess portion may include a plurality of recess portions, and the plurality of recess portions may include: a first recess portion; a second recess portion spaced from the first recess portion; a third recess portion that is symmetrical with the first recess portion with respect to the corresponding symmetry point; and a fourth recess portion that is symmetrical with the second recess portion with respect to the corresponding symmetry point.

In an embodiment, each of the recess portions may have a polygonal shape in a plan view.

In an embodiment, the recess portion may overlap with the corresponding symmetry point in a plan view.

In an embodiment, the recess portion may have a closed-curve shape surrounding the corresponding symmetry point in a plan view.

In an embodiment, areas of the first cell openings may be different from areas of the second cell openings in a plan view.

In an embodiment, a distance between adjacent ones of the first cell openings may be different from a distance between adjacent ones of the second cell openings in a plan view.

According to one or more embodiments of the present disclosure, a mask assembly includes: a plurality of masks located along one direction; and a frame underneath the plurality of masks. Each of the masks includes a body portion including a cell area, and a peripheral area surrounding the cell area, the body portion having a plurality of cell openings defined therein. At least one of the masks include: a plurality of mark patterns at the peripheral area, and including at least one recess portion; and a hole adjacent to a first mark pattern from among the mark patterns. Each of the mark patterns has a point-symmetrical shape with respect to a corresponding symmetry point.

In an embodiment, the cell area may include a first area, and a second area adjacent to the first area, and the plurality of cell openings may include: first cell openings defined at the first area, and spaced from each other; and second cell openings defined at the second area, and spaced from each other, the second cell openings being different from the first cell openings.

In an embodiment, the hole may overlap with the corresponding symmetry point in a plan view.

In an embodiment, the recess portion of the first mark pattern may be spaced from the hole.

In an embodiment, the recess portion of the first mark pattern may be connected integrally to the hole.

In an embodiment, an opening may be defined in the frame, and the opening may overlap with the hole and the plurality of cell openings in a plan view.

According to one or more embodiments of the present disclosure, a method of manufacturing a display panel, includes: forming a first mask assembly including: a first mask including first group cell openings, first group mark patterns spaced from the first group cell openings, and a first hole; and a first frame; forming a second mask assembly including: a second mask including second group cell openings that are the same as the first group cell openings, second group mark patterns that are the same as the first group mark patterns, and a second hole; and a second frame; forming first patterns including first light emitting patterns, and a first test thin film on a target substrate using the first mask assembly; forming second patterns including second light emitting patterns, and a second test thin film on the target substrate using the second mask assembly; adjusting a position of the first mask assembly according to a position of the first test thin film; and adjusting a position of the second mask assembly according to a position of the second test thin film. The second light emitting patterns are formed on the first light emitting patterns, respectively, and the first test thin film and the second test thin film are formed at different positions from each other.

In an embodiment, the first light emitting patterns and the second light emitting patterns may include organic patterns configured to emit the same color light as each other.

In an embodiment, the first group mark patterns and the second group mark patterns may be formed by a half-etching process.

In an embodiment, each of the first group mark patterns and the second group mark patterns may include: a first mark pattern having a point-symmetrical shape with respect to a first symmetry point; and a second mark pattern having a point-symmetrical shape with respect to a second symmetry point.

In an embodiment, the forming of the first mask assembly may include: providing a mask including cell openings, the first mark pattern, and the second mark pattern; and irradiating a laser beam onto the first symmetry point to form the first hole. The forming of the second mask assembly may include: providing a mask that is the same as the mask; and irradiating a laser beam onto the second symmetry point to form the second hole.

According to one or more embodiments of the present disclosure, a mask may include the mark patterns to be aligned with the substrate, and the reliability of the display panel, which is manufactured using the mask, may be improved. The mask is able to be used commonly according to a color of the light emitting pattern to be deposited using the mask. Thus, a cost of manufacturing the mask may be reduced.

BRIEF DESCRIPTION OF THE DRAWINGS

The above and other aspects and features of the present disclosure will be more clearly understood from the following detailed description of the illustrative, non-limiting example embodiments with reference to the accompanying drawings, in which.

DETAILED DESCRIPTION

Figure 1A:
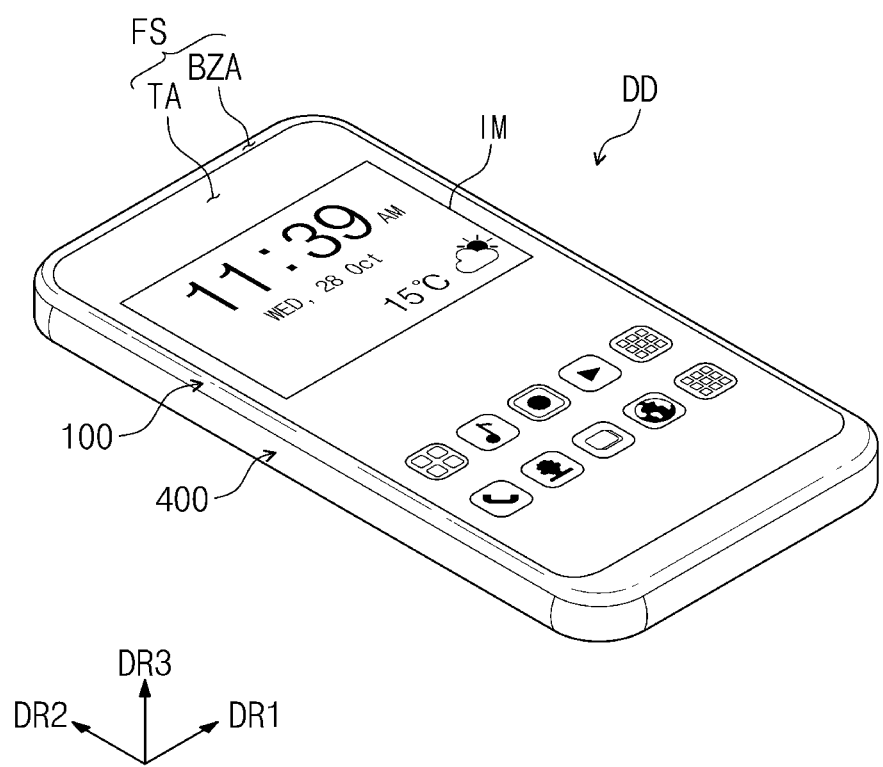
FIG. 1A is a perspective view showing a display device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the first direction DR1, the second direction DR2, and the third direction DR3 are not limited to the three axes of the rectangular coordinate system, and may be interpreted in a broader sense. For example, the first direction DR1, the second direction DR2, and the third direction DR3 may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a mask, a mask assembly, and a method of manufacturing a display panel according to embodiments of the present disclosure will be described in more detail with reference to the accompanying drawings.

Figure 1B:
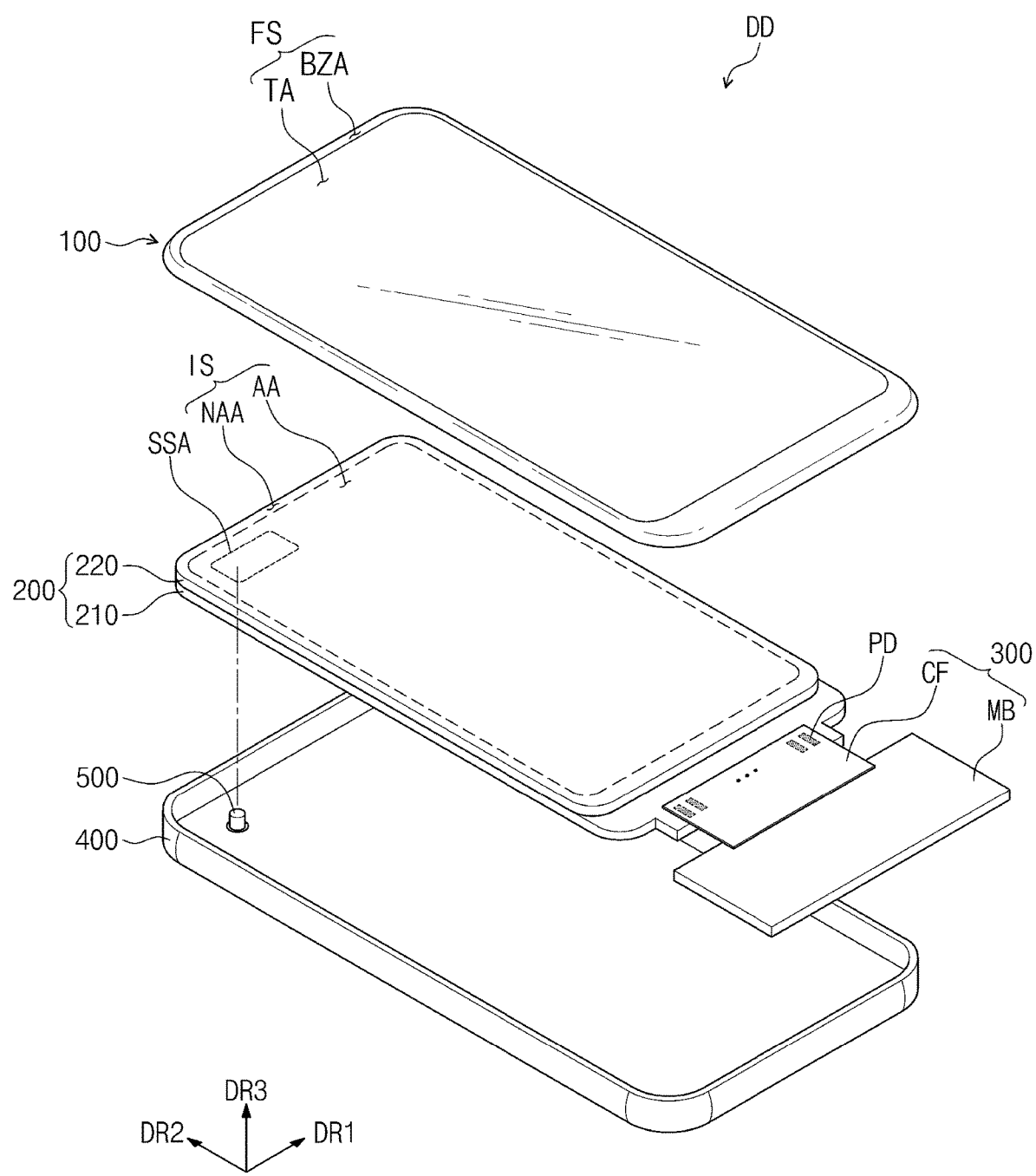
FIG. 1B is an exploded perspective view showing a display device according to an embodiment of the present disclosure.

FIG. 1A is a perspective view showing a display device according to an embodiment of the present disclosure, and FIG. 1B is an exploded perspective view showing the display device of FIG. 1.

The display device DD may be a device that is activated in response to an electrical signal. The display device DD may include various suitable embodiments. For example, the display device DD may be applied to various suitable electronic devices, for example, such as a mobile phone, a smart watch, a tablet computer, a notebook computer, a smart television, and/or the like. However, the present disclosure is not limited thereto, and the display device DD may be applied to other suitable electronic devices as long as they do not depart from the spirit and scope of the present disclosure. In the present embodiment, the mobile phone is shown and described in more detail as a representative example of the display device DD.

The display device DD may display an image IM through a display surface FS, which is parallel or substantially parallel to each of a first direction DR1 and a second direction DR2, toward a third direction DR3. The display surface FS, through which the image IM is displayed, may correspond to a front surface of the display device DD. The image IM may include a still image and/or a moving image (e.g., a video).

In the present embodiment, the front (or the upper) and the rear (or the lower) surfaces of each member of the display device DD may be defined with respect to a direction in which the image IM is displayed. The front and rear surfaces may be opposite to each other in the third direction DR3, and a normal line direction of each of the front and rear surfaces may be parallel or substantially parallel to the third direction DR3. A distance in the third direction DR3 between the front and rear surfaces of a corresponding member may correspond to a thickness of the corresponding member in the third direction (e.g., the thickness direction) DR3 of the display device DD. As used herein, the expressions "when viewed in a plane" or "in a plan view" may refer to a view from a direction (e.g., a view from the third direction DR3) that is perpendicular to or substantially perpendicular to a relevant surface (e.g., a front surface or a top surface) of the relevant member. The directions indicated by the first, second, and third directions DR1, DR2, and DR3 shown in the figures are relative to each other, and thus, the directions indicated by the first, second, and third directions DR1, DR2, and DR3 may be variously modified to other suitable directions.

Referring to FIGS. 1A and 1B, the display device DD may include a window 100, a display module (e.g., a display layer) 200, a driving circuit 300, a housing 400, and an electronic module (e.g., an electronic component or an electronic device) 500. In the present embodiment, the window 100 and the housing 400 may be connected to (e.g., coupled to or attached to) each other to provide an exterior of the display device DD.

The window 100 may include an optically transparent material. For example, the window 100 may include glass, sapphire, or a plastic material. The window 100 may have a single-layer structure or a multi-layered structure. As an example, the window 100 having the multi-layered structure, and may include a plurality of plastic films connected to (e.g., coupled to or stacked on) each other, or a glass substrate and a plastic film connected to (e.g., coupled to or stacked on) the glass substrate.

The window 100 may include a transmissive area TA and a bezel area BZA. The front surface of the display device DD may correspond to the transmissive area TA and the bezel area BZA of the window 100.

The transmissive area TA may be an optically transparent area. The user may view the image IM through the transmissive area TA. In the present embodiment, the transmissive area TA may have a quadrangular shape with rounded vertices, but the present disclosure is not limited thereto. The transmissive area TA may have a variety of suitable shapes, and should not be particularly limited.

The bezel area BZA may be an area having a relatively lower transmittance when compared with that of the transmissive area TA. For example, the bezel area BZA may correspond to an area at (e.g., in or on) which a material having a suitable color (e.g., a predetermined color) is included (e.g., is printed).

The bezel area BZA may be defined to be adjacent to the transmissive area TA. For example, the bezel area BZA may surround (e.g., around a periphery of) the transmissive area TA. Accordingly, the transmissive area TA may have a shape defined by the bezel area BZA, but the present disclosure is not limited thereto, and the bezel area BZA may be disposed to be adjacent to only one or more sides of the transmissive area TA or may be omitted.

The display module 200 may be disposed under (e.g., underneath) the window 100. The display module 200 may include a display panel 210, and an input sensing unit (e.g., an input sensing layer or an input sensor) 220. The display module 200 may display the image IM, and may sense an external input. The display module 200 may include a front surface IS including an active area AA and a peripheral area NAA.

The active area AA may be an area activated by an electrical signal. In the present embodiment, the active area AA may be an area through which the image IM is displayed, and may correspond to or substantially correspond to an area where the external input is sensed (e.g., concurrently or simultaneously).

The transmissive area TA may overlap with at least a portion of the active area AA. Accordingly, the user may view the image IM, or may provide the external input, through the transmissive area TA. However, the present disclosure is not limited thereto. In other words, an area through which the image IM is displayed and an area through which the external input is sensed may be spaced apart (e.g., separated) from each other at (e.g., in or on) the active area AA, and are not particularly limited.

The peripheral area NAA may be covered by the bezel area BZA. The peripheral area NAA may be blocked by the bezel area BZA, and thus, the peripheral area NAA may not be viewed from the outside. The peripheral area NAA may be defined to be adjacent to the active area AA. For example, the peripheral area NAA may surround (e.g., around a periphery of) the active area AA. A driving circuit and/or a driving line to drive the pixels may be arranged at (e.g., in or on) the peripheral area NAA.

In the present embodiment, the active area AA and the peripheral area NAA are shown as being flat or substantially flat, but the present disclosure is not limited thereto, and a portion of the peripheral area NAA and a portion of the active area AA may be bent. In this case, the portion of the peripheral area NAA may be bent toward a rear surface of the display device DD, and thus, a size of the bezel area BZA may be reduced at the front surface of the display device DD.

The display panel 210 may be a liquid crystal display panel or a light-emitting type display panel, but the present disclosure is not limited thereto. For example, the display panel 210 may be an organic light emitting display panel or a quantum dot light emitting display panel. A light emitting layer of the organic light emitting display panel may include an organic light emitting material. A light emitting layer of the quantum dot light emitting display panel may include a quantum dot and/or a quantum rod.

The display panel 210 may be flexible. As used herein, the term "flexible" when describing a member may mean that the member has a bendable property, which includes a structure that is completely folded, a structure that is partially curved, and all the structures in between. For example, the display panel 210 may be a curved display panel or a foldable display panel. However, the display panel 210 it not limited thereto or thereby, and the display panel 210 may be a rigid display panel 210.

The input sensing unit 220 may be disposed on the display panel 210. As shown in FIG. 1B, the input sensing unit 220 may be disposed directly on the display panel 210. In other words, the input sensing unit 220 may be formed on the display panel 210 through successive processes, and thus, an adhesive film may not be disposed between the input sensing unit 220 and the display panel 210. However, the present disclosure is not limited thereto, and according to an embodiment, an adhesive film may be further disposed between the input sensing unit 220 and the display panel 210. In this case, the input sensing unit 220 may be fixed to (e.g., connected to or attached to) an upper surface of the display panel 210 by the adhesive film after being manufactured through a separate process from that of the display panel 210.

The input sensing unit 220 may sense the external input applied thereto from the outside. The external input includes various suitable forms of inputs provided from the outside of the display device DD. For example, the external inputs may be provided in the form of a force, a pressure, a temperature, light, and/or the like. The external inputs may include a proximity input (e.g., a hovering input) applied when an object (e.g., the user's finger or a pen) approaches close to or adjacent to the display device DD at a suitable distance (e.g., a predetermined distance), as well as a touch input by a user's body (e.g., the user's hand or finger).

The driving circuit 300 may be electrically connected to the display module 200. The driving circuit 300 may include a main circuit board MB and a flexible circuit board CF.

The flexible circuit board CF may be electrically connected to the display module 200. The flexible circuit board CF may be connected to pads PD of the display module 200, which are disposed at (e.g., in or on) the peripheral area NAA. The flexible circuit board CF may provide electrical signals to the display module 200 to drive the display module 200. The electrical signals may be generated by the flexible circuit board CF or the main circuit board MB.

The main circuit board MB may include various driving circuits to drive the display module 200, or a connector to provide a power. The main circuit board MB may be a rigid printed circuit board or a flexible printed circuit board.

While one flexible circuit board CF connecting the display module 200 and the main circuit board MB to each other is shown in FIG. 1B, the present disclosure is not limited thereto, and a plurality of flexible circuit boards CF may be included. In other words, the flexible circuit board CF may include a plurality of flexible circuit boards CF, and the plurality of flexible circuit boards CF may connect the display panel DP and the main circuit board MB to each other.

The electronic module 500 may be disposed under (e.g., underneath) the display module 200. In the present embodiment, the electronic module 500 may overlap with the active area AA, and may be disposed under (e.g., underneath) the display module 200. The electronic module 500 may include a variety of suitable functional modules. For example, the electronic module 500 may include a heat sensing module (e.g., a heat sensor), a light emitting module (e.g., a light emitting device), an audio output module (e.g., an audio output device), a camera module (e.g., a camera), and/or the like.

The housing 400 may be connected to (e.g., coupled to or attached to) the window 100. The housing 400 may be connected to (e.g., coupled to or attached to) the window 100 to provide an inner space therebetween. The display module 200 and the electronic module 500 may be accommodated in the inner space.

The housing 400 may include a suitable material with a relatively high rigidity. For example, the housing 400 may include glass, a plastic material, or a metal material. The housing 400 may include a plurality of frames and/or plates or combinations thereof. The housing 400 may stably protect the components of the display device DD accommodated in the inner space from an external impact.

According to an embodiment, the display module 200 may include a sensing area SSA defined therein. The sensing area SSA may be an area overlapping with the electronic module 500. The display device DD may receive external signals for the electronic module 500, or may provide signals from the electronic module 500 to the outside, through the sensing area SSA. For example, the electronic module 500 may sense an external object through the sensing area SSA, or may provide a sound signal, for example, such as a voice, or an optical signal, for example, such as an infrared ray, to the outside through the sensing area SSA.

The sensing area SSA may be defined to overlap with the transmissive area TA. In this case, a separate area that is used for the sensing area SSA overlapping with the electronic module 500 at (e.g., in or on) the bezel area BZA may be omitted. Accordingly, the size of the bezel area BZA may be reduced.

According to an embodiment, the sensing area SSA of the display module 200 may have a relatively high transmittance when compared with that of a portion of the active area AA that does not overlap with the sensing area SSA. For example, at least some of the elements of the display module 200 may be removed or omitted at (e.g., in or on) the sensing area SSA. Thus, the electronic module 500 may easily transmit and/or receive signals through the sensing area SSA.

Figure 2:
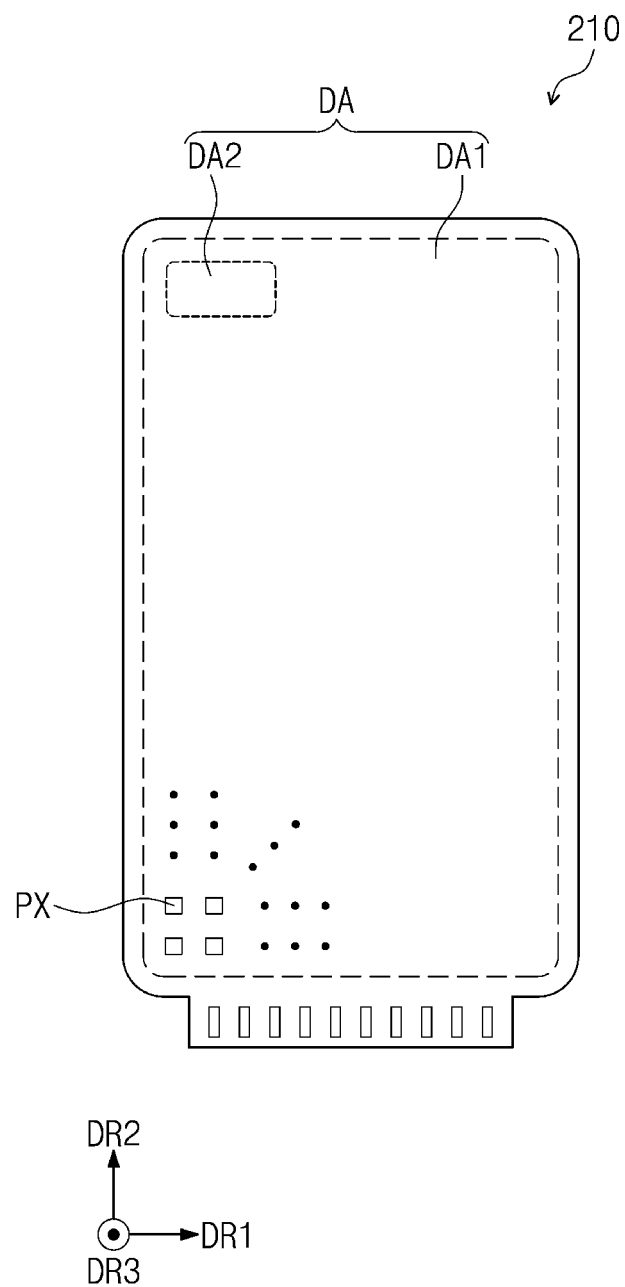
FIG. 2 is a plan view showing a display panel according to an embodiment of the present disclosure.

FIG. 2 is a plan view showing a display panel according to an embodiment of the present disclosure. The display panel 210 may include a display area DA at (e.g., in or on) which an image is displayed. The display area DA may correspond to the active area AA (e.g., refer to FIG. 1B) of the display module 200. The display area DA may include a first display area DA1 and a second display area DA2. Each of the first display area DA1 and the second display area DA2 may include a plurality of pixels PX.

Each of the pixels PX may include a display element, and a thin film transistor electrically connected to the display element. The display element may include, for example, an organic light emitting diode. The pixels PX may be arranged at (e.g., in or on) the display area DA, and may provide light (e.g., may emit light). The pixels PX may be arranged at (e.g., in or on) the first display area DA1 and the second display area DA2, but the present disclosure is not limited thereto. For example, some of the pixels PX may be arranged at (e.g., in or on) the non-display area.

The pixels PX may be arranged along the first direction DR1, and the second direction DR2 crossing (e.g., perpendicular to or substantially perpendicular to) the first direction DR1 in a matrix form. According to an embodiment, the pixels PX may include first to third light emitting pixels for displaying a red color, a green color, and a blue color, respectively.

The first display area DA1 may be defined to be adjacent to the second display area DA2. As shown in FIG. 2, the first display area DA1 may surround (e.g., around a periphery of) the second display area DA2. However the present disclosure is not limited thereto or thereby, and according to an embodiment, the first display area DA1 may be an area that is adjacent to one or more sides of the second display area DA2. The first display area DA1 and the second display area DA2 may have a variety of suitable shapes depending on the sensing area SSA (e.g., refer to FIG. 1B), and should not be particularly limited.

According to an embodiment, the second display area DA2 may be defined to correspond to the sensing area SSA (e.g., refer to FIG. 1B). For example, in a case where two sensing areas SSA are defined, two second display areas DA2 may be defined to overlap with the two sensing areas SSA (e.g., refer to FIG. 1B).

When viewed in a plane (e.g., in a plan view), the second display area DA2 may overlap with the sensing area SSA (e.g., refer to FIG. 1B). The second display area DA2 may have the same or substantially the same size as that of the sensing area SSA (e.g., refer to FIG. 1B), but the present disclosure is not limited thereto or thereby. In other words, the size of the second display area DA2 may be greater than that of the sensing area SSA (e.g., refer to FIG. 1B). Accordingly, a degree of freedom in changing a position of the electronic module 500 may be increased.

The second display area DA2 may overlap with the electronic module 500 (e.g., refer to FIG. 1B) disposed under (e.g., underneath) the display panel 210. A transmittance of the second display area DA2 may be greater than a transmittance of the first display area DA1. Accordingly, signals may be transmitted to and/or received from (e.g., may be easily transmitted to and/or received from) the electronic module 500 (e.g., refer to FIG. 1B) via the second display area DA2.

When viewed in a plane (e.g., in a plan view), the second display area DA2 may have a variety of suitable shapes. As shown in FIG. 2, the second display area DA2 may have a quadrangular shape, but the present disclosure is not limited thereto or thereby. According to an embodiment, the second display area DA2 may have a circular shape.

FIG. 2 shows a structure in which the second display area DA2 is defined at an upper left portion of the display area DA as a representative example, but the present disclosure is not limited thereto. In some other examples, the second display area DA2 may be defined in other various suitable areas, for example, such as an upper right portion, a central (e.g., a center) portion, a lower left portion, or a lower right portion of the display area DA according to (e.g., depending on) the position of the electronic module 500.

FIG. 2 shows one second display area DA2, but the present disclosure is not limited thereto or thereby, and the second display area DA2 may be provided in a plurality. The second display area DA2 may be defined as two or more areas that are spaced (e.g., that are separated) from each other according to the use of the electronic module 500. For example, one of the second display areas DA2 may be defined at the upper left portion of display area DA, and another of the second display areas DA2 may be defined at the upper right portion of the display area DA. Each of the second display areas DA2 may be surrounded (e.g., around a periphery thereof) by the first display area DA1.

The pixels PX arranged at (e.g., in or on) the first display area DA1 may have a density that is different from a density of the pixels PX arranged at (e.g., in or on) the second display area DA2, which may increase the transmittance of the second display area DA2. In addition, the second display area DA2 may have a resolution that is smaller than a resolution of the first display area DA1.

For example, the number of the pixels PX arranged at (e.g., in or on) the second display area DA2 may be smaller than the number of the pixels PX arranged at (e.g., in or on) the first display area DA1 for the same sized unit area. In other words, a planar area of the pixels PX arranged at (e.g., in or on) the second display area DA2 may be smaller than that of the pixels PX arranged at (e.g., in or on) the first display area DA1. The pixels PX arranged at (e.g., in or on) the first display area DA1 and the second display area DA2 will be described in more detail below with reference to FIGS. 3A and 3B.

Figure 3A:
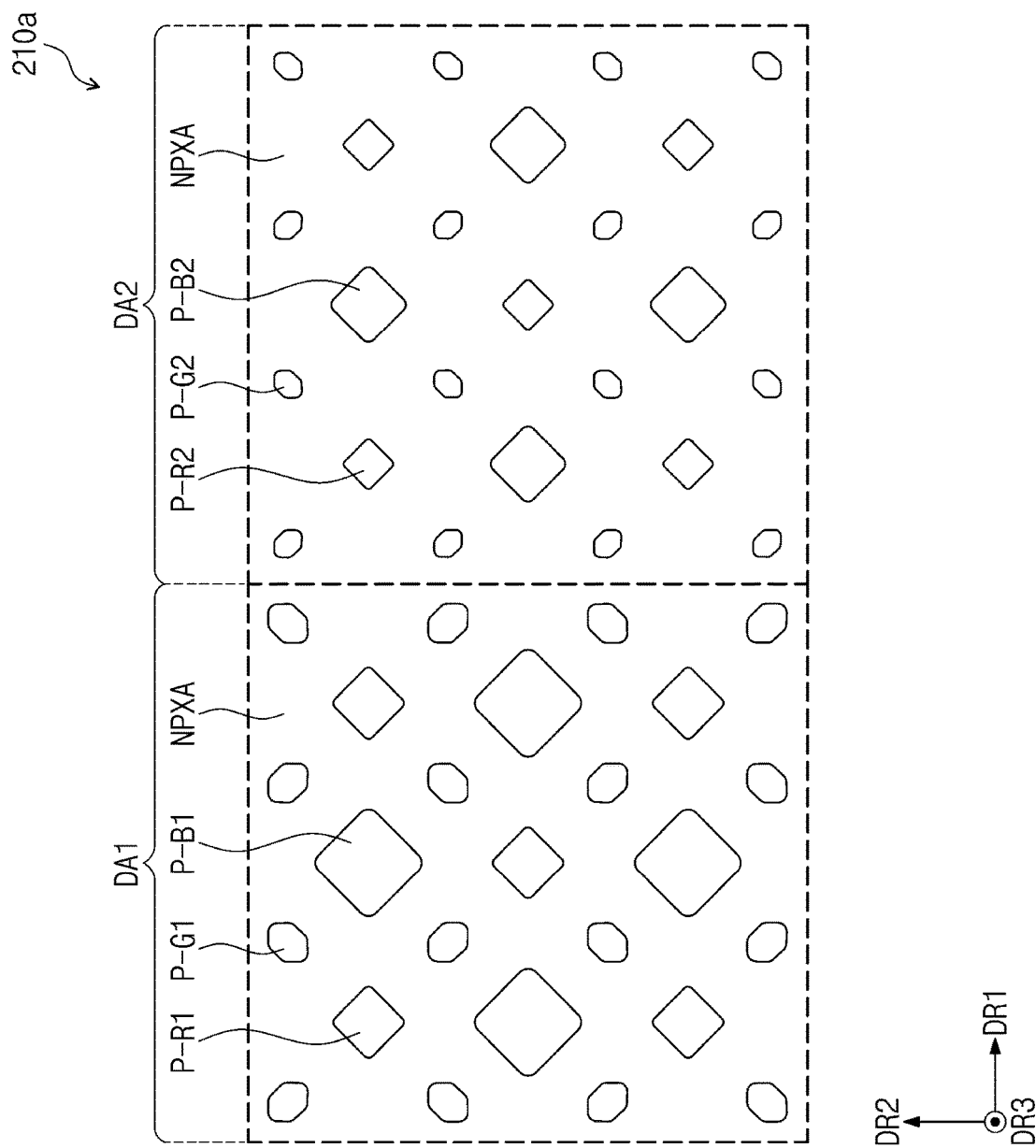
FIGS. 3A-3B are enlarged plan views showing a portion of a display panel according to one or more embodiments of the present disclosure.
Figure 3B:
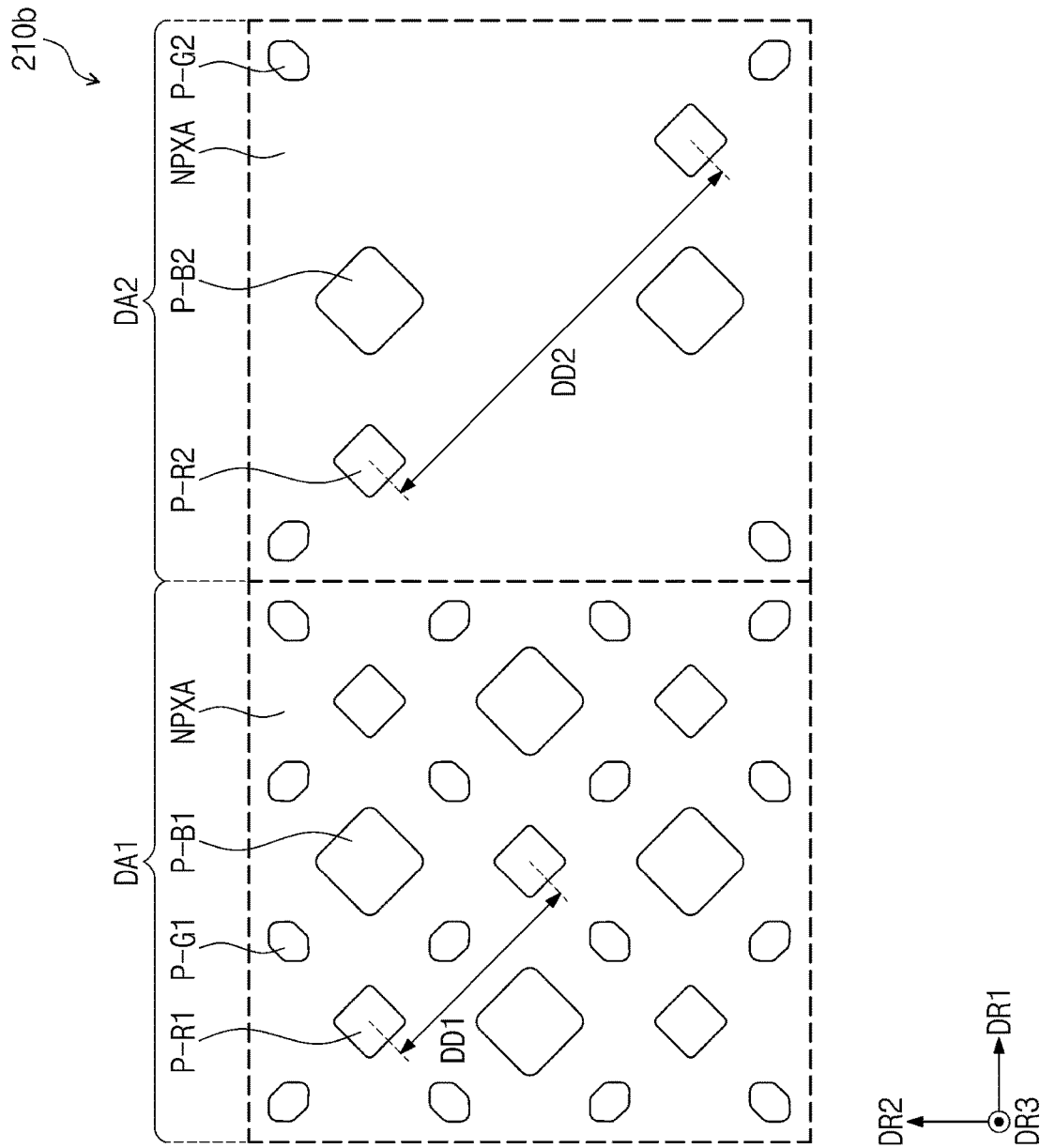

FIGS. 3A and 3B are enlarged plan views showing a portion of a display panel according to one or more embodiments of the present disclosure. FIGS. 3A and 3B show areas including a boundary between the first display area DA1 and the second display area DA2.

Referring to FIGS. 3A and 3B, each of the display panels 210a and 210b may include a plurality of light emitting areas P-R1, P-G1, P-B1, P-R2, P-G2, and P-B2, and a non-light-emitting area NPXA surrounding (e.g., around peripheries of) the light emitting areas P-R1, P-G1, P-B1, P-R2, P-G2, and P-B2. The light emitting areas P-R1, P-G1, P-B1, P-R2, P-G2, and P-B2 may correspond to a plurality of light emitting pixels. The light emitting pixels may include first light emitting pixels, second light emitting pixels, and third light emitting pixels according to an emission color thereof. The first to third light emitting pixels may correspond to the above-described pixels PX.

The light emitting areas P-R1, P-G1, P-B1, P-R2, P-G2, and P-B2 may include first light emitting areas P-R1 and P-R2, second light emitting areas P-G1 and P-G2, and third light emitting areas P-B1 and P-B2. The first light emitting areas P-R1 and P-R2 may correspond to the first light emitting pixels, the second light emitting areas P-G1 and P-G2 may correspond to the second light emitting pixels, and the third light emitting areas P-B1 and P-B2 may correspond to the third light emitting pixels.

The first light emitting areas P-R1 and P-R2, the second light emitting areas P-G1 and P-G2, and the third light emitting areas P-B1 and P-B2 may be distinguished from each other according to (e.g., depending on) the colors of light emitted therefrom. As an example, the first light emitting areas P-R1 and P-R2 may be areas for emitting the red light, the second light emitting areas P-G1 and P-G2 may be areas for emitting the green light, and the third light emitting areas P-B1 and P-B2 may be areas for emitting the blue light.

The first light emitting areas P-R1 and P-R2, the second light emitting areas P-G1 and P-G2, and the third light emitting areas P-B1 and P-B2 may be disposed to be spaced apart from each other. As shown in FIGS. 3A and 3B, the first light emitting areas P-R1 and P-R2 and the third light emitting areas P-B1 and P-B2 may be alternately arranged with each other in the first direction DR1 and the second direction DR2. The second light emitting areas P-G1 and P-G2 may be arranged along a diagonal direction defined between the first direction DR1 and the second direction DR2. A shape in which the first, second, and third light emitting areas P-R1, P-G1, P-B1, P-R2, P-G2, and P-B2 are arranged shown in FIGS. 3A and 3B is in an RGBG matrix structure (or otherwise known as a PENTILE® structure, PENTILE® being a duly registered trademark of Samsung Display Co., Ltd., of Yongin-si, Republic of Korea). However, the present disclosure is not limited thereto, and the arrangement structure of the light emitting areas P-R1, P-G1, P-B1, P-R2, P-G2, and P-B2 may be any suitable arrangement structure, for example, such as a stripe structure in which the light emitting areas P-R1, P-G1, P-B1, P-R2, P-G2, and P-B2 are sequentially arranged along one direction, but the present disclosure is not particularly limited thereto.

The first light emitting areas P-R1 and P-R2, the second light emitting areas P-G1 and P-G2, and the third light emitting areas P-B1 and P-B2 may have different sizes from each other. In this case, the size may refer to a planar area when viewed in a plane (e.g., in a plan view). As an example, when viewed in a plane (e.g., in a plan view), the size of the third light emitting area P-B1 may be the greatest from among the light emitting areas, and the size of the second light emitting area P-G1 may be the smallest from among the light emitting areas, but the present disclosure is not limited thereto or thereby. The light emitting areas P-R1, P-G1, P-B1, P-R2, P-G2, and P-B2 may have the same or substantially the same size as each other, or may have various suitable sizes according to (e.g., depending on) the emission colors thereof, and thus, the present disclosure is not particularly limited.

When viewed in a plane (e.g., in a plan view), the light emitting areas P-R1, P-G1, P-B1, P-R2, P-G2, and P-B2 may have a variety of suitable shapes, for example, such as a circular shape, a polygonal shape, and/or the like. The first light emitting areas P-R1 and P-R2, the second light emitting areas P-G1 and P-G2, and the third light emitting areas P-B1 and P-B2 may have different shapes from each other, or may have the same or substantially the same shape as each other. However, the shape of the first, second, and third light emitting areas P-R1, P-G1, P-B1, P-R2, P-G2, and P-B2 are not be limited thereto or thereby.

Some light emitting areas P-R1, P-G1, and P-B1 may overlap with the first display area DA1, and other light emitting areas P-R2, P-G2, and P-B2 may overlap with the second display area DA2. The light emitting areas P-R1, P-G1, and P-B1 overlapping with the first display area DA1 and the light emitting areas P-R2, P-G2, and P-B2 overlapping with the second display area DA2 may be spaced apart from each other at different distances, and/or may have different sizes from one another. Accordingly, the transmittance of the second display area DA2 may be higher than the transmittance of the first display area DA1.

Referring to FIG. 3A, the sizes of the light emitting areas P-R2, P-G2, and P-B2 overlapping with the second display area DA2 of the display panel 210a may be smaller than the sizes of the light emitting areas P-R1, P-G1, and P-B1 overlapping with the first display area DA1 of the display panel 210a. As an example, the light emitting areas P-R2, P-G2, and P-B2 overlapping with the second display area DA2 may have the same or substantially the same shape as those of the light emitting areas P-R1, P-G1, and P-B1 overlapping with the first display area DA1, but may have sizes that are smaller than those of the light emitting areas P-R1, P-G1, and P-B1 overlapping with the first display area DA1.

The non-light-emitting area NPXA overlapping with the second display area DA2 may include portions that are optically transparent. Accordingly, as the sizes of the light emitting areas P-R2, P-G2, and P-B2 overlapping with the second display area DA2 are smaller than the sizes of the light emitting areas P-R1, P-G1, and P-B1 of the first display area DA1, the size of the non-light-emitting area NPXA may increase at (e.g., in or on) the second display area DA2. Accordingly, the transmittance of the second display area DA2 may increase.

Referring to FIG. 3B, the distance between the light emitting areas P-R2, P-G2, and P-B2 overlapping with the second display area DA2 of the display panel 210b may be greater than the distance between the light emitting areas P-R1, P-G1, and P-B1 overlapping with the first display area DA1. For convenience of illustration, FIG. 3B shows a first distance DD1 between the first light emitting areas P-R1 adjacent to each other at (e.g., in or on) the first display area DA1 along a diagonal direction, and a second distance DD2 between the first light emitting areas P-R2 adjacent to each other at (e.g., in or on) the second display area DA2 along the diagonal direction. In FIG. 3B, the first distance DD1 indicates a straight distance between a center of one first light emitting area P-R1 and a center of another first light emitting area P-R1 at (e.g., in or on) the first display area DA1, and the second distance DD2 indicates a straight distance between a center of one first light emitting area P-R2 and a center of another first light emitting area P-R2 at (e.g., in or on) the second display area DA2.

The first distance DD1 and the second distance DD2 may be different from each other. For example, the second distance DD2 may be greater than the first distance DD1. As the distances are different from each other, the number of the light emitting areas P-R2, P-G2, and P-B2 overlapping with the second display area DA2 may be smaller than the number of the light emitting areas P-R1, P-G1, and P-B1 overlapping with the first display area DA1 for the same sized unit area. In other words, the density of the light emitting areas P-R2, P-G2, and P-B2 at (e.g., in or on) the second display area DA2 may be smaller than the density of the light emitting areas P-R1, P-G1, and P-B1 at (e.g., in or on) the first display area DA1. Accordingly, the transmittance of the second display area DA2 may be increased.

Figure 4:
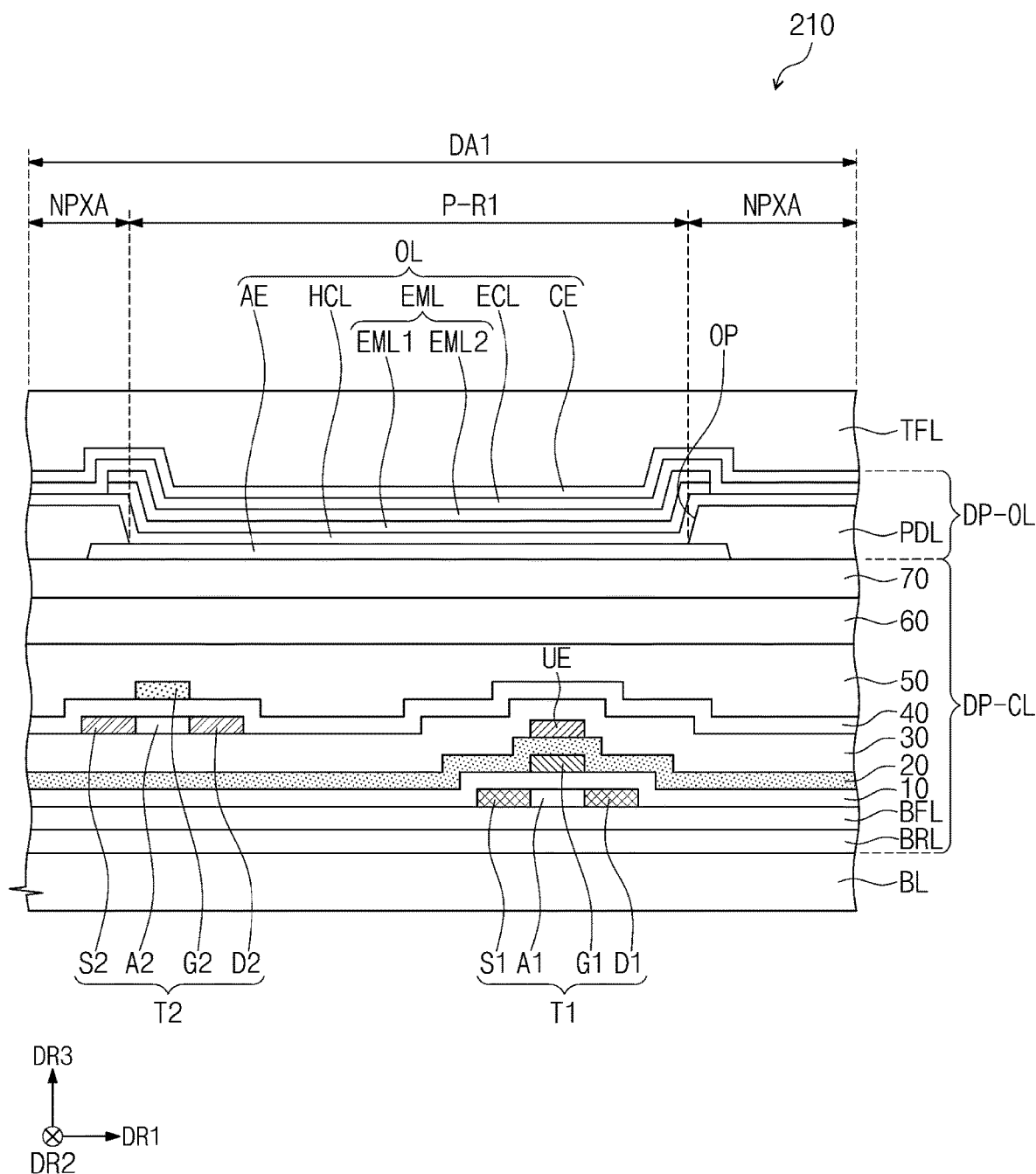
FIG. 4 is a cross-sectional view showing a display panel according to an embodiment of the present disclosure.

FIG. 4 is a cross-sectional view showing a display panel according to an embodiment. FIG. 4 schematically shows a cross-section of the first light emitting area P-R1 overlapping with the first display area DA1. The first light emitting area P-R1 may correspond to the first light emitting pixel.

Referring to FIG. 4, the display panel 210 may include a base layer BL, a circuit element layer DP-CL, a display element layer DP-OL, and an encapsulation layer TFL.

The base layer BL may be a display substrate on which the circuit element layer DP-CL and the display element layer DP-OL are disposed. The base layer BL may include at least one of a silicon substrate, a plastic substrate, a glass substrate, a polymer layer, or a stack structure including a plurality of insulating layers.

The circuit element layer DP-CL may be disposed on the base layer BL. The circuit element layer DP-CL may include at least one insulating layer and a circuit element. The circuit element may include a signal line, and a driving circuit of the pixel. The circuit element layer DP-CL may be formed by forming an insulating layer, a semiconductor layer, and a conductive layer through a coating or deposition process, and then by patterning the insulating layer, the semiconductor layer, and the conductive layer through several photolithography processes.

According to an embodiment, the circuit element layer DP-CL may include a barrier layer BRL, a buffer layer BFL, first, second, third, fourth, fifth, sixth, and seventh insulating layers 10, 20, 30, 40, 50, 60, and 70, and a plurality of thin film transistors T1 and T2. The buffer layer BFL, the barrier layer BRL, and the first to seventh insulating layers 10, 20, 30, 40, 50, 60, and 70 may include at least one of an inorganic layer and an organic layer.

The barrier layer BRL may be disposed on the base layer BL. The barrier layer BRL may prevent or substantially prevent impurities present in the base layer BL and/or moisture from the outside from being diffused to the thin film transistors T1 and T2. The impurities may be one or more gases or sodium generated by pyrolysis of the base layer BL.

The buffer layer BFL may be disposed on the barrier layer BRL. The semiconductor pattern may be disposed on the buffer layer BFL. The buffer layer BFL may increase an adhesion (e.g., an adhesion strength) between the base layer BL and the semiconductor pattern.

The thin film transistors T1 and T2 included in the circuit element layer DP-CL may include a first pixel transistor T1 and a second pixel transistor T2. The first pixel transistor T1 and the second pixel transistor T2 may be disposed at (e.g., in or on) the first display area DA1. A plurality of pixel transistors may be disposed at (e.g., in or on) the second display area DA2 (e.g., refer to FIGS. 3A and 3B). The first pixel transistor T1 and the second pixel transistor T2 may form the pixel PX with a light emitting element OL disposed on the first and second pixel transistors T1 and T2.

FIG. 4 shows an arrangement relationship between a first active A1, a second active A2, a first gate G1, a second gate G2, a first source S1, a second source S2, a first drain D1, and a second drain D2, which form the first and second pixel transistors T1 and T2.

In the present embodiment, the first active A1 and the second active A2 may include different materials from each other. As an example, the first active A1 may include a polysilicon semiconductor, and the second active A2 may include a metal oxide semiconductor. However, the present disclosure is not limited thereto, and according to an embodiment, the first active A1 and the second active A2 may include the same or substantially the same material as each other. In this case, a stacked structure of the circuit element layer DP-CL may be relatively simplified.

The first source S1 and the first drain D1 may have a doping concentration higher than that of the first active A1, and may have a function of an electrode. The second source S2 and the second drain D2 may be areas where the metal oxide semiconductor is reduced, and may have a function of an electrode.

The circuit element layer DP-CL may further include an upper electrode UE. The upper electrode UE may be disposed to overlap with the first gate G1. The upper electrode UE may serve as a gate electrode of the first pixel transistor T1 together with the first gate G1, or may form a capacitor with the first gate G1. However, this is provided merely as an example, and thus, the present disclosure is not limited thereto. According to an embodiment, the upper electrode UE may be omitted from the display panel DP.

The display element layer DP-OL may be disposed on the circuit element layer DP-CL. The display element layer DP-OL may include the light emitting element OL and a pixel definition layer PDL. The light emitting element OL may include an organic light emitting diode or a quantum dot light emitting diode. The light emitting element OL may include a first electrode AE, a hole control layer HCL, a light emitting layer EML, an electron control layer ECL, and a second electrode CE, which are sequentially stacked on one another.

The first electrode AE may be disposed on the seventh insulating layer 70. At least a portion of the first electrode AE may be exposed through an opening OP of the pixel definition layer PDL. A plurality of openings OP of the pixel definition layer PDL may define the light emitting areas P-R1, P-G1, P-B1, P-R2, P-G2, and P-B2 (e.g., refer to FIGS. 3A and 3B). Accordingly, the size of each of the light emitting areas P-R1, P-G1, P-B1, P-R2, P-G2, and P-B2 (e.g., refer to FIGS. 3A and 3B) may correspond to an area of a corresponding first electrode AE exposed through a corresponding opening OP of the pixel definition layer PDL. The non-light-emitting area NPXA may correspond to the pixel definition layer PDL.

The hole control layer HCL and the electron control layer ECL may be commonly disposed at (e.g., in or on) the light emitting area P-R1 and the non-light-emitting area NPXA. The hole control layer HCL and the electron control layer ECL may be commonly formed for a plurality of the pixels using an open mask.

The light emitting layer EML may be provided in a pattern shape to correspond to the opening OP of the pixel definition layer PDL. The light emitting layer EML may be formed differently according to the light emitting pixels. The light emitting layer EML may be deposited in a different way from the hole control layer HCL and the electron control layer ECL having a film shape. The mask assembly according to one or more embodiments of the present disclosure may be used to form the light emitting layer EML having a suitable pattern (e.g., a predetermined pattern).

The light emitting layer EML may have a structure in which a plurality of light emitting layers are stacked one on another. The light emitting layer EML may include a first light emitting layer EML1, and a second light emitting layer EML2 disposed on the first light emitting layer EML1. The color of the light emitted from the first light emitting layer EML1 may be the same or substantially the same as the color of the light emitted from the second light emitting layer EML2. However, the wavelength range of the emission spectrum of the first light emitting layer EML1 may be different from that of the second light emitting layer EML2. Each of the first light emitting layer EML1 and the second light emitting layer EML2 may be provided in a pattern shape to correspond to the opening OP of the pixel definition layer PDL. The first light emitting layer EML1 and the second light emitting layer EML2 may be sequentially deposited and formed using mask assemblies MSA, which will be described in more detail below. FIG. 4 shows a structure in which the light emitting layers EML1 and EML2 are stacked, but the present disclosure is not limited thereto, and the light emitting layer EML corresponding to some light emitting areas may have a single-layer structure.

The second electrode CE may be disposed on the electron control layer ECL. The second electrode CE may be commonly disposed at (e.g., in or on) the light emitting area P-R1 and the non-light-emitting area NPXA.

The encapsulation layer TFL may be disposed on the display element layer DP-OL. The encapsulation layer TFL may include a plurality of thin layers. The thin layers may include an inorganic layer and an organic layer. Some thin layers may be disposed to improve an optical efficiency, and some thin layers may be disposed to protect the light emitting element from oxygen and/or moisture.

Figure 5:
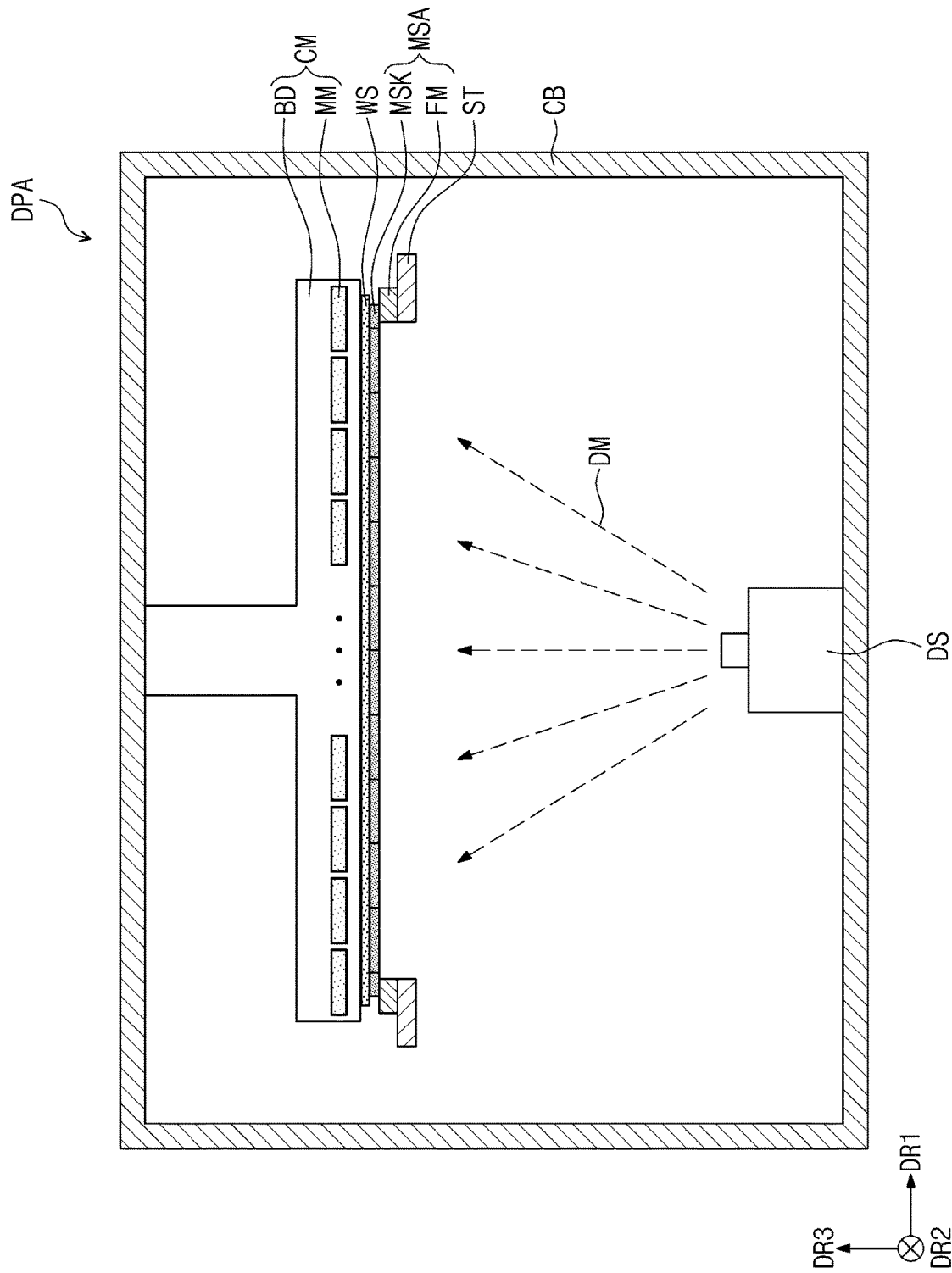
FIG. 5 is a cross-sectional view showing a deposition apparatus according to an embodiment of the present disclosure.
Figure 6:
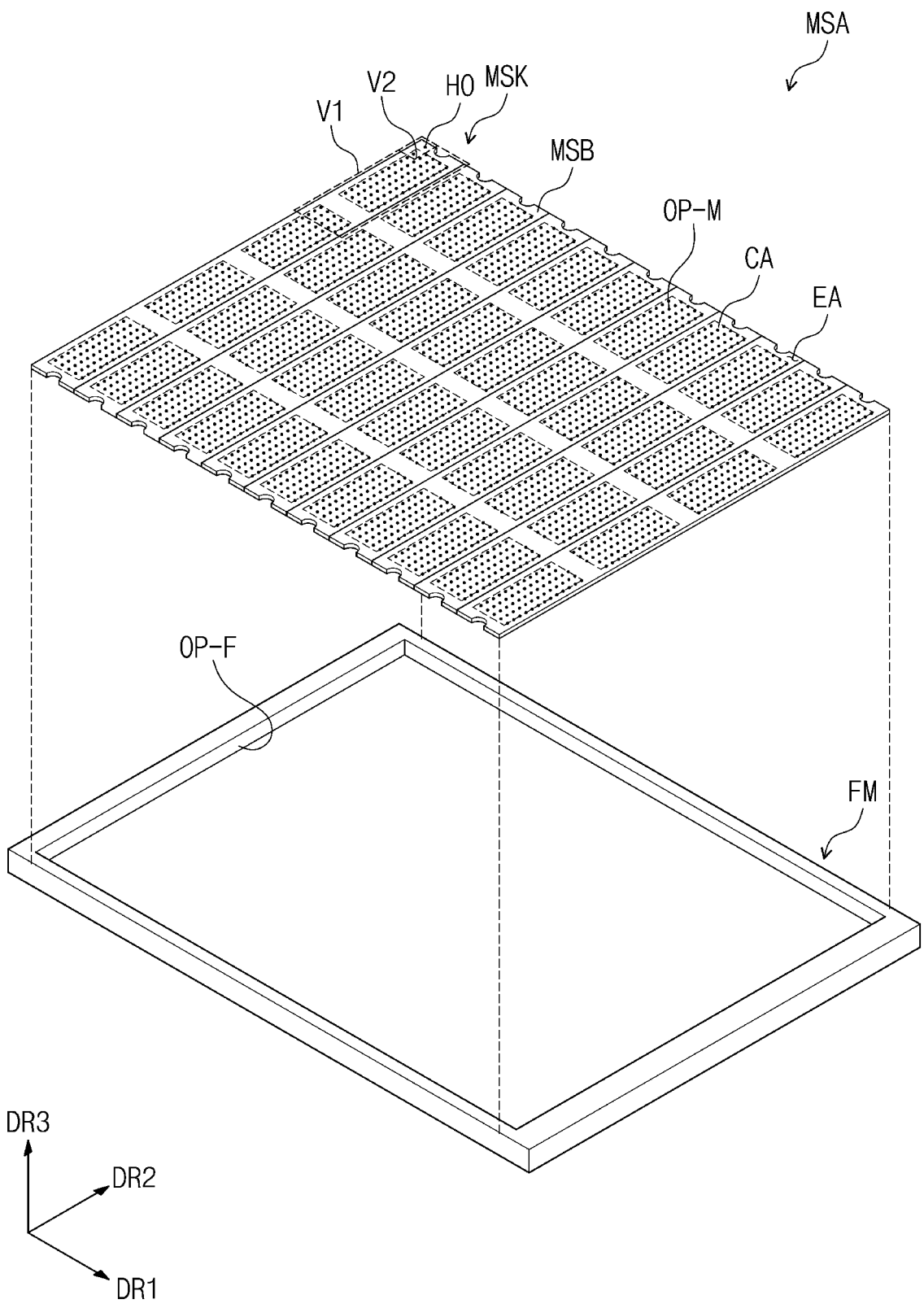
FIG. 6 is a perspective view showing a mask assembly according to an embodiment of the present disclosure.

FIG. 5 is a cross-sectional view showing a deposition apparatus according to an embodiment of the present disclosure, and FIG. 6 is a perspective view showing a mask assembly according to an embodiment of the present disclosure. The deposition apparatus DPA may be used for a deposition process for manufacturing the display panel DP of FIG. 4, and more particularly, a deposition process to form the light emitting layer EML. The light emitting layer EML formed by using the deposition apparatus DPA may be provided in a pattern shape corresponding to the light emitting areas P-R1, P-G1, P-B1, P-R2, P-G2, and P-B2 shown in FIGS. 3A and 3B.

Referring to FIG. 5, the deposition apparatus DPA may include a deposition chamber CB, a fixing member CM, a deposition source DS, and a mask assembly MSA. In some embodiments, the deposition apparatus DPA may further include an additional mechanical device to implement an inline system.

A deposition condition of the deposition chamber CB may be set at a vacuum state. The deposition chamber CB may include a bottom surface, a ceiling surface, and sidewalls. The bottom surface of the deposition chamber CB may be parallel to or substantially parallel to a plane defined by the first direction DR1 and the second direction DR2. A normal line direction of the bottom surface of the deposition chamber CB may be parallel to or substantially parallel to the third direction DR3.

The fixing member CM may be disposed in the deposition chamber CB. The fixing member CM may be disposed over the deposition source DS, and may be installed at the ceiling surface of the deposition chamber CB. The fixing member CM may include a body BD, and magnetic members MM connected to (e.g., coupled to or attached to) the body BD.

The body BD may include a plate to fix the mask assembly MSA to a target substrate WS disposed between the body BD and the mask assembly MSA. However, the body BD is not particularly limited thereto, as long as the mask assembly MSA is fixed. The magnetic members MM may be disposed inside or outside of the body BD. The magnetic members MM may fix the mask assembly MSA using a magnetic force.

The deposition source DS may include a deposition material. The deposition material may be a sublimable material or a vaporable material, and may include at least one of a metal material, an inorganic material, and an organic material. As an example, the deposition source DS may include a light emitting material to form the light emitting layer EML (e.g., refer to FIG. 4).

The deposition material included in the deposition source DS may be ejected as deposition vapor DM. The deposition vapor DM may be deposited on the target substrate WS through the mask assembly MSA to form a suitable pattern (e.g., a predetermined pattern).

A stage ST may be disposed in the deposition chamber CB, and may be disposed over the deposition source DS. The stage ST may support the mask assembly MSA. The stage ST may further include a driver that moves the mask assembly MSA to accurately align the mask assembly MSA with the target substrate WS. The stage ST may be disposed outside a path of the deposition vapor DM supplied from the deposition source DS to the target substrate WS.

The mask assembly MSA may be disposed on the stage ST in the deposition chamber CB. The mask assembly MSA may include a mask MSK and a frame FM. The target substrate WS may be disposed on the mask assembly MSA.

The target substrate WS may include a glass substrate or a plastic substrate. For example, the target substrate WS may include a polymer layer disposed on a base substrate, the base substrate may be removed in a latter part of the manufacturing process of the display panel, and the polymer layer may correspond to the base layer BL of the display panel DP shown in FIG. 4. However, the present disclosure is not limited thereto or thereby.

After the deposition process using the deposition apparatus DPA is performed, light emitting pattern layers corresponding to the light emitting areas P-R1, P-G1, P-B1, P-R2, P-G2, and P-B2 may be formed on the target substrate WS as shown in FIGS. 3A and 3B.

The target substrate WS on which the deposition process is performed may be a substrate on which a plurality of display panels DP before being cut are formed. The plurality of display panels DP may be provided by cutting along cutting lines defined in the target substrate WS, and separating portions of the target substrate WS from each other, but the present disclosure is not limited thereto or thereby. According to an embodiment, the target substrate WS may be a substrate on which one display panel DP is formed according to a size of the display panel DP to be manufactured.

Referring to FIG. 6, the mask assembly MSA may include a frame FM, and a plurality of masks MSK. For convenience of illustration, the frame FM and the masks MSK are shown to be separated from each other in FIG. 6.

The frame FM may be provided with a frame opening OP-F defined therethrough. The frame opening OP-F may be a hole penetrating through the frame FM from an upper surface to a lower surface of the frame FM. A portion of a lower surface of the masks MSK may be exposed to the deposition source DS through the frame opening OP-F.

The frame FM may have a quadrangular ring shape when viewed in a plane (e.g., in a plan view), but the present disclosure is not limited thereto or thereby. According to an embodiment, the frame FM may have a polygonal ring shape or a circular ring shape when viewed in a plane (e.g., in the plan view), but the present disclosure is not limited thereto, and the shape of the frame FM is not particularly limited as long as the frame FM may support the masks MSK.

The frame FM may include a metal material. For example, the frame FM may include nickel (Ni), nickel-cobalt alloy, nickel-iron alloy, stainless steel (SUS), or Invar alloy, but the present disclosure is not limited thereto, and the material for the frame FM is not limited thereto or thereby.

The masks MSK may be disposed on the frame FM. The masks MSK may extend in the second direction DR2, and may be arranged along the first direction DR1. The masks MSK may include a metal material having a relatively small thermal expansion coefficient when compared with the frame FM. The masks MSK may include nickel (Ni), nickel-cobalt alloy, nickel-iron alloy, or the like.

Each of the masks MSK may include a body portion MSB and cell openings OP-M. The body portion MSB may form an exterior of the mask MSK. The body portion MSB may include a cell area CA, and a peripheral area EA surrounding (e.g., around a periphery of) the cell area CA when viewed in a plane (e.g., in a plan view).

The cell area CA may be defined in a plurality, and the plurality of cell areas CA may be spaced apart from each other in the second direction DR2. The peripheral area EA may surround (e.g., around peripheries of) the cell areas CA. The cell areas CA of the masks MSK included in the mask assembly MSA may be arranged along the first direction DR1 and the second direction DR2 in a matrix form.

The cell openings OP-M may be arranged in each of the cell areas CA according to a suitable rule (e.g., a predetermined or specific rule). The cell openings OP-M may be defined through the body portion MSB of the mask MSK. When viewed in a plane (e.g., in a plan view), the cell openings OP-M may have a shape corresponding to a shape of the light emitting layer EML to be deposited therefrom. As an example, when viewed in a plane (e.g., in a plan view), the shape of the cell openings OP-M may correspond to the shape of the first light emitting areas P-R1 and P-R2, the second light emitting areas P-G1 and P-G2, or the third light emitting areas P-B1 and P-B2 shown in FIG. 3A.

At least one mask from among the masks MSK may include a plurality of mark patterns and a hole HO. The hole HO may be defined to overlap with the peripheral area EA. The hole HO may be defined through the body portion MSB of the mask MSK. The hole HO may be defined to be adjacent to one mark pattern from among the mark patterns, which will be described in more detail below.

The masks MSK may be connected to (e.g., coupled to or attached to) the frame FM by a welding process. In the manufacturing process of the mask assembly MSA, each of the masks MSK may be tensioned in the first direction DR1 and/or the second direction DR2, and then each of the tensioned masks MSK may be welded to the frame FM.

As the mask assembly MSA includes the plurality of masks MSK that are separated from each other, a sagging phenomenon of a mask may occur less frequently in the masks MSK than that in one large mask corresponding to one frame FM. According to an embodiment, the mask assembly MSA may include the mask MSK having an integral plate shape extending in the first direction DR1 and the second direction DR2, but the present disclosure is not limited thereto.

Figure 7:
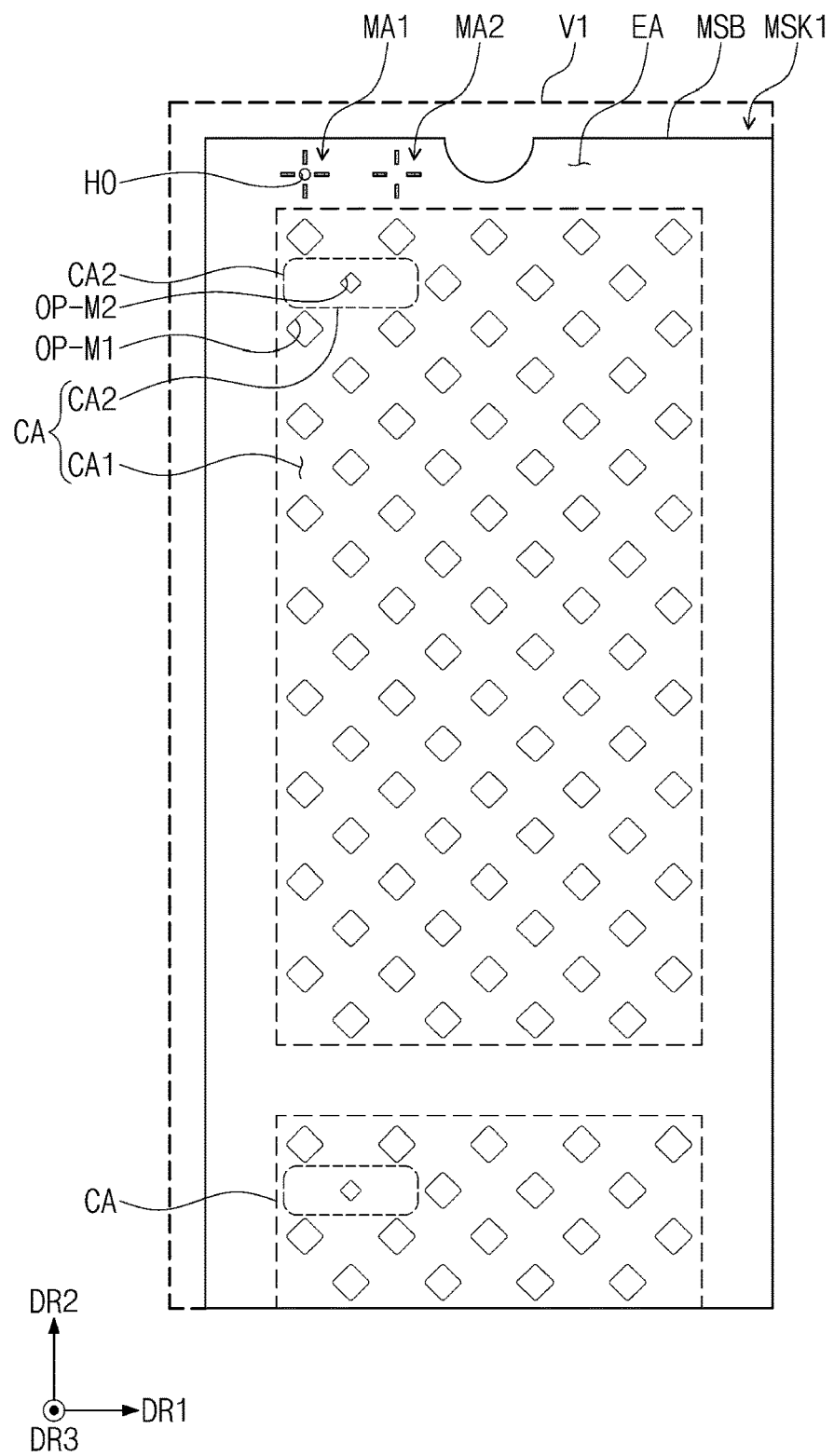
FIG. 7 is a plan view showing a portion of the mask assembly shown in FIG. 6.

FIG. 7 is an enlarged plan view showing the portion V1 of the mask assembly shown in FIG. 6. FIG. 7 is a plan view showing one mask MSK1 from among the masks MSK included in the mask assembly MSA.

Referring to FIG. 7, the mask MSK1 may include the body portion MSB, the cell openings OP-M1 and OP-M2, and the mark patterns MA1 and MA2. For convenience of illustration, the cell openings OP-M1 and OP-M2 included in the mask MSK1 may be exaggeratedly illustrated with respect to an actual scale.

The body portion MSB may include the cell area CA, and the peripheral area EA surrounding (e.g., around a periphery of) the cell area CA. The cell area CA may include a first area CA1 and a second area CA2. In the deposition process, the first area CA1 may correspond to the first display area DA1 (e.g., refer to FIG. 3A) of the display panel DP. The second area CA2 may correspond to the second display area DA2 (e.g., refer to FIG. 3A) of the display panel DP.

The cell openings OP-M1 and OP-M2 may be defined at (e.g., in or on) the cell area CA, and may be spaced apart from each other. The cell openings OP-M1 and OP-M2 may include first cell openings OP-M1 defined at (e.g., in or on) the first area CA1, and second cell openings OP-M2 defined at (e.g., in or on) the second area CA2.

The first cell openings OP-M1 may have a shape corresponding to a shape of some of the light emitting patterns deposited at (e.g., in or on) the first display area DA1 (e.g., refer to FIG. 3A) that emit lights having the same color as each other. As an example, the shape of the first cell openings OP-M1 may correspond to the shape of the first light emitting area P-R1 overlapping with the first display area DA1 (e.g., refer to FIG. 3A).

The second cell openings OP-M2 may have a shape corresponding to a shape of some of the light emitting patterns deposited at (e.g., in or on) the second display area DA2 (e.g., refer to FIG. 3A) that emit lights having the same color as each other. As an example, the shape of the second cell openings OP-M2 may correspond to the shape of the first light emitting area P-R2 overlapping with the second display area DA2 (e.g., refer to FIG. 3A).

Each of the first cell openings OP-M1 and the second cell openings OP-M2 may be arranged in a suitable rule (e.g., a predetermined or specific rule). As an example, the first cell openings OP-M1 and the second cell openings OP-M2 may be arranged to correspond to the arrangement of the first light emitting areas P-R1 and P-R2 defined at (e.g., in or on) the display area DA of the display panel DP.

The first cell openings OP-M1 may be different from the second cell openings OP-M2. The second cell openings OP-M2 may have a size (e.g., an area) that is different from a size (e.g., an area) of the first cell openings OP-M1. As an example, areas of the second cell openings OP-M2 may be smaller than areas of the first cell openings OP-M1 when viewed in a plane (e.g., in a plan view) as shown in FIG. 7.

Further, in a mask according to an embodiment, a distance between the second cell openings OP-M2 that are adjacent to each other may be different from a distance between the first cell openings OP-M1 that are adjacent to each other (e.g., see FIG. 3B). For example, the distance between the second cell openings OP-M2 that are adjacent to each other may be greater than the distance between the first cell openings OP-M1 that are adjacent to each other.

The first cell openings OP-M1 and the second cell openings OP-M2 may have different sizes from each other, and the different distances between the adjacent ones of the cell openings. The display panels may be manufactured to include light emitting pixels with different sizes and/or distances from one another in some areas using the mask MSK1 including the first and second cell openings OP-M1 and OP-M2 with different sizes and/or distances according to (e.g., depending on) some areas.

The first cell openings OP-M1 and the second cell openings OP-M2 may be defined through the body portion MSB. The first cell openings OP-M1 and the second cell openings OP-M2 may be formed by etching the body portion MSB using a photomask.

The mark patterns MA1 and MA2 may be disposed at (e.g., in or on) the peripheral area EA. As an example, the mark patterns MA1 and MA2 may be disposed at the upper left portion of the mask MSK1, but the present disclosure is not limited thereto or thereby. According to an embodiment, the mark patterns MA1 and MA2 may be disposed at an upper center portion of the mask MSK1, or between the cell areas CA of the mask MSK1. The positions of the mark patterns MA1 and MA2 may be variously modified according to (e.g., depending on) a position of an alignment mark AM (e.g., refer to FIG. 12) of the target substrate WS, but the present disclosure is not particularly limited thereto.

The mark patterns MA1 and MA2 may be spaced apart from each other in one direction. FIG. 7 shows the mark patterns MA1 and MA2 are spaced apart from each other in the first direction DR1, but the present disclosure is not limited thereto or thereby. According to an embodiment, the mark patterns MA1 and MA2 may be connected to each other with a recess pattern interposed therebetween.

The mark patterns MA1 and MA2 may be patterns that are recessed from an upper surface or a lower surface of the body portion MSB. The mark patterns MA1 and MA2 may be formed by a half-etching process. When viewed in a plane (e.g., in a plan view), each of the mark patterns MA1 and MA2 may have a single closed-curve shape, or a multiple closed-curve shape.

The mark patterns MA1 and MA2 may be marks indicating a position at which the hole HO is formed. The hole HO may be used as a reference to position the first and second cell openings OP-M1 and OP-M2. Each of the mark patterns MA1 and MA2 may have a point-symmetrical shape with respect to a symmetry point. The symmetry point may correspond to an indicator of the position at which the hole HO is formed.

The mark patterns MA1 and MA2 may have the same or substantially the same shape as each other, but the present disclosure is not limited thereto or thereby. For example, the mark patterns MA1 and MA2 may have different shapes from each other as long as they can indicate the position at which the hole HO is formed.

The mark patterns MA1 and MA2 may be indicators that are used as the reference to position the cell openings OP-M1 and OP-M2. The positions of the mark patterns MA1 and MA2 and the cell openings OP-M1 and OP-M2 may be changed according to (e.g., depending on) the tension of the mask MSK1. The mark patterns MA1 and MA2 and the cell openings OP-M1 and OP-M2 included in the mask MSK1 may be designed by taking into account the change in position due to the tension.

The mark patterns MA1 and MA2 may be concurrently (e.g., simultaneously or substantially simultaneously) formed with the cell openings OP-M1 and OP-M2 of the mask MSK1. As an example, in the same etching process, the cell openings OP-M1 and OP-M2 may be etched to penetrate through the body portion MSB, and the mark patterns MA1 and MA2 may be etched to be recessed from the upper surface or the lower surface of the body portion MSB, but the present disclosure is not limited thereto or thereby. For example, the mark patterns MA1 and MA2 may be formed by additional processes after the cell openings OP-M1 and OP-M2 are formed.

The mask MSK1 may include the hole HO defined at (e.g., in or on) the peripheral area EA. The hole HO may be used as the reference to align the mask assembly MSA and the target substrate WS to one another in the deposition process. The mask assembly MSA and the target substrate WS may be aligned with each other by adjusting a center of the hole HO to coincide with a reference point of the alignment mark AM (e.g., refer to FIG. 12) included at (e.g., in or on) the target substrate WS.

The hole HO may be defined to be adjacent to one mark pattern from among the mark patterns MA1 and MA2. FIG. 7 shows that the hole HO is defined to be adjacent to the first mark pattern MA1 from among the first mark pattern MA1 and the second mark pattern MA2, but the present disclosure is not limited thereto. The position of the hole HO may be variously modified depending on the kind (e.g., the type) of the light emitting pattern to be deposited.

The hole HO may be formed in the manufacturing process of the mask assembly MSA, but not in the process of forming the cell openings OP-M1 and OP-M2 of the mask MSK1. In other words, the mask MSK1 may not include the hole HO before being connected to (e.g., coupled to or attached to) the frame FM. The hole HO may be formed after the mask MSK1 is tensioned and connected to (e.g., coupled to or attached to) the frame FM, or may be formed before the mask MSK1 is tensioned.

The hole HO may be used as an indicator to align the target substrate WS with the mask assembly MSA (e.g., refer to FIG. 5) in the deposition process. In addition, the hole HO may be used to form a test thin film that is used to correct an alignment position between the target substrate WS and the mask assembly MSA (e.g., refer to FIG. 5) in the deposition process.

The hole HO may be formed through a separate process from that of the cell openings OP-M1 and OP-M2. Accordingly, the number of photomasks used to manufacture the masks in which the positions of the cell openings OP-M1 and OP-M2 are the same as each other and the positions of the hole HO are different from each other may be reduced.

The masks in which the cell openings have the same shape as each other and are defined through the same position as each other may be used to deposit a plurality of light emitting layers formed in the same light emitting pattern on the same target substrate. However, the masks with different hole positions may be used in each deposition process in order to form test thin films that are spaced apart from each other and are used as a reference to position each of the deposited light emitting layers.

In more detail, the test thin films that are concurrently (e.g., simultaneously or substantially simultaneously) formed with the light emitting pattern on the target substrate may be used to inspect and correct an alignment position of the mask and the target substrate with each other. The test thin films may be formed via the hole defined through the mask. Because the alignment of the mask and the target substrate is corrected with respect to the position where the test thin films are formed, the test thin films may be formed to be spaced apart from each other for each deposited layer for accurate correction. Accordingly, the masks used in each deposition process may be provided with the holes defined through different positions from each other.

According to a comparative method, masks are manufactured to be provided with holes defined in upper and lower portions of a peripheral area, and the masks are rotated 180 degrees while being used for the deposition process of light emitting patterns having the same shape as each other. However, the masks provided with the cell openings having different shapes from each other according to an area in which the cell openings are defined may not be used after rotating the masks 180 degrees as in the comparative method.

According to one or more embodiments of the present disclosure, however, the mask that includes the mark patterns indicating the positions where the holes are formed may be provided to manufacture the masks through which the cell openings formed at the same position and in the same shape as each other are defined, and the holes formed at different positions are defined. In other words, after manufacturing a plurality of masks including the cell openings and the mark patterns at the same position using the same photomask, the position of the hole may be selectively formed so as to be adjacent to any suitable one of the mark patterns according to the light emitting pattern to be formed by using the mask. Accordingly, the manufacturing process of the mask may be simplified, and the manufacturing cost of the mask may be reduced.

Figure 8A:
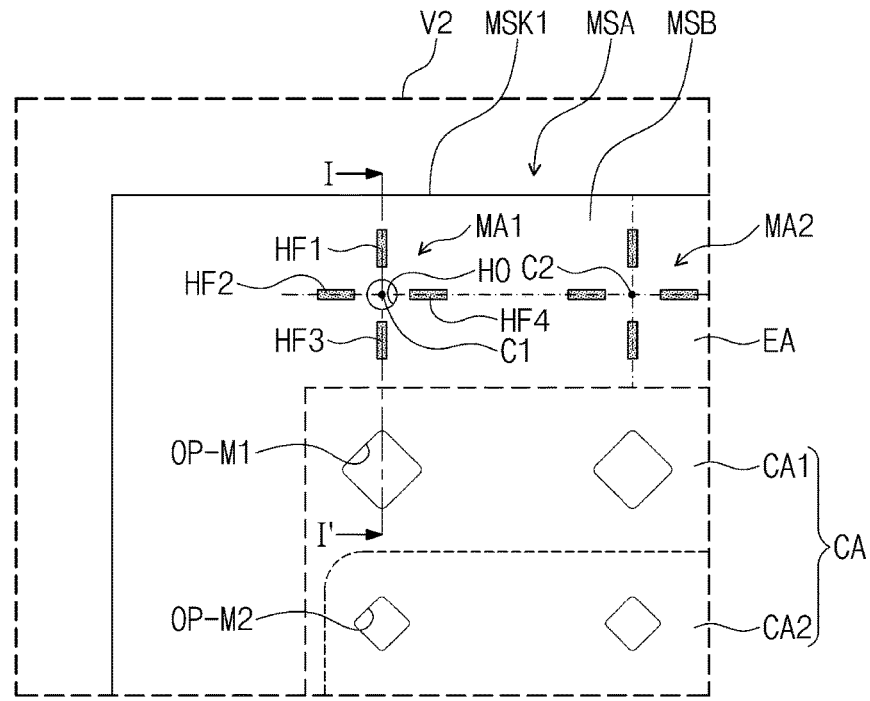
FIG. 8A is a plan view showing a portion of the mask assembly shown in FIG. 6 according to an embodiment of the present disclosure.
Figure 8B:
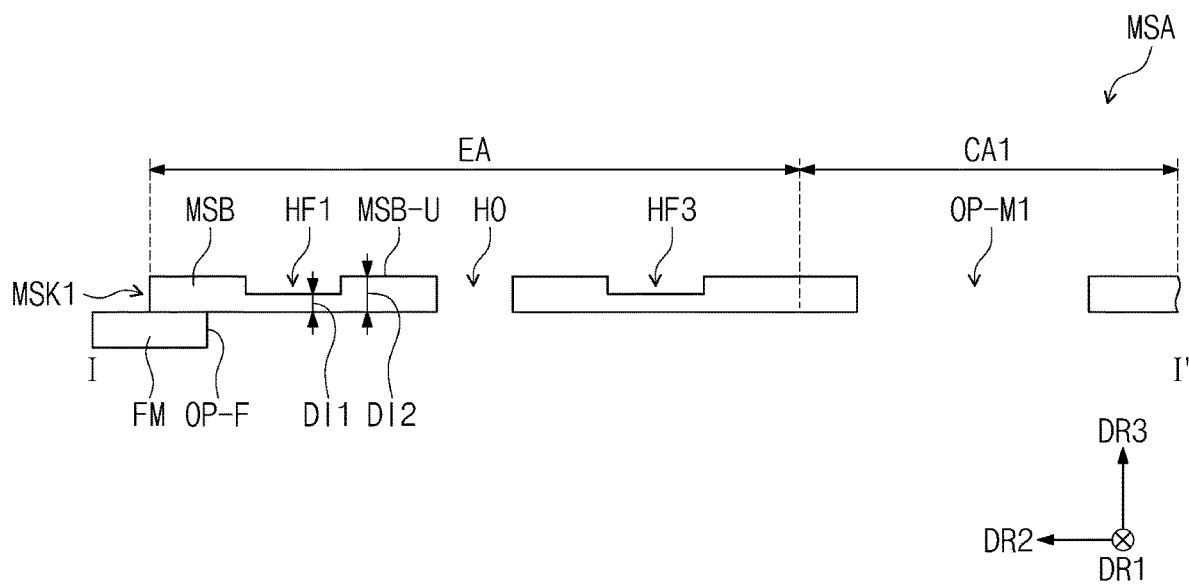
FIG. 8B is a cross-sectional view taken along the line I-I' of FIG. 8A to show a mask assembly according to an embodiment of the present disclosure.
Figure 8C:
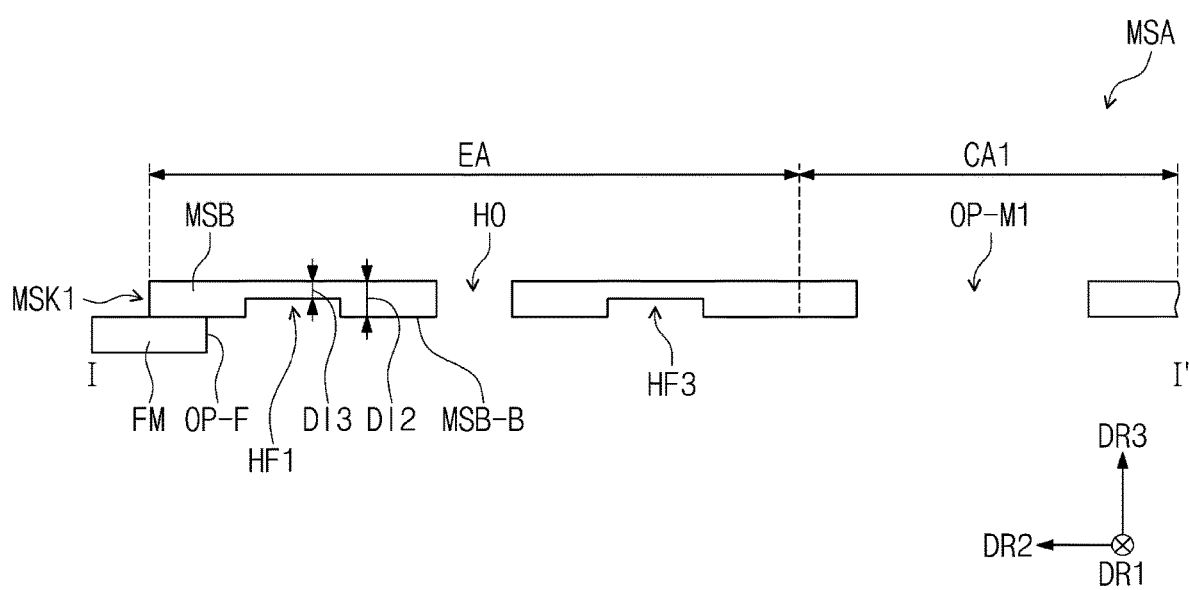
FIG. 8C is a cross-sectional view taken along the line I-I' of FIG. 8A to show a mask assembly according to an embodiment of the present disclosure.

FIG. 8A is a plan view showing the portion V2 of the mask assembly shown in FIG. 6 according to an embodiment of the present disclosure. FIGS. 8B and 8C are cross-sectional views taken along the line I-I' of FIG. 8A to show a mask assembly according to various embodiments of the present disclosure. In FIGS. 8A to 8C, the same reference symbols are used to denote the same or substantially the same elements described above with reference to FIGS. 1 to 7, and thus, redundant description thereof may not be repeated.

The mark patterns MA1 and MA2 may include the first mark pattern MA1 and the second mark pattern MA2. Each of the first and second mark patterns MA1 and MA2 may have the point-symmetrical shape with respect to a corresponding symmetry point. The first mark pattern MA1 may have the point-symmetrical shape with respect to a first symmetry point C1, and the second mark pattern MA2 may have the point-symmetrical shape with respect to a second symmetry point C2.

Each of the first and second mark patterns MA1 and MA2 may include one or more recess portions HF1, HF2, HF3, and HF4. The recess portions HF1, HF2, HF3, and HF4 may have a shape that is recessed from an upper surface MSB-U or a lower surface MSB-B of the body portion MSB of the mask MSK1. The mark patterns MA1 and MA2 may include the recess portions HF1, HF2, HF3, and HF4, thereby indicating the positions where the hole HO is formed.

The recess portions HF1, HF2, HF3, and HF4 may have a closed-curve shape when viewed in a plane (e.g., in a plan view). As an example, FIG. 8A shows each of the recess portions HF1, HF2, HF3, and HF4 as having a quadrangular closed-curve shape in a plane (e.g., in the plan view). However, the present disclosure is not limited thereto or thereby, and the recess portions HF1, HF2, HF3, and HF4 may have any suitable closed-curved shape, for example, such as a polygonal shape, a circular shape, or a ring shape, in a plan view.

The recess portions HF1, HF2, HF3, and HF4 may have the same or substantially the same shape as each other when viewed in a plane (e.g., in a plan view), but the present disclosure is not limited thereto or thereby. According to an embodiment, some of the recess portions HF1, HF2, HF3, and HF4 may have a different shape from those of the others of the recess portions HF1, HF2, HF3, and HF4. For example, some of the recess portions HF1, HF2, HF3, and HF4 may have a quadrangular shape, and others of the recess portions HF1, HF2, HF3, and HF4 may have a triangular shape.

The recess portions HF1, HF2, HF3, and HF4 may have the point-symmetrical relationship with respect to the symmetry points C1 and C2 of the mark patterns MA1 and MA2. Referring to FIG. 8A, the recess portions HF1, HF2, HF3, and HF4 included in the first mark pattern MA1 may be referred to as a first recess portion HF1, a second recess portion HF2, a third recess portion HF3, and a fourth recess portion HF4, respectively.

The first recess portion HF1 and the third recess portion HF3 may have a symmetrical relationship with respect to the first symmetry point C1 along the second direction DR2. The second recess portion HF2 and the fourth recess portion HF4 may have a symmetrical relationship with respect to the first symmetry point C1 along the first direction DR1. Each of the first and third recess portions HF1 and HF3 may have a quadrangular shape having long sides extending in the second direction DR2, and each of the second and fourth recess portions HF2 and HF4 may have a quadrangular shape having long sides extending in the first direction DR1.

The hole HO may be defined to be adjacent to one mark pattern from among the first and second mark patterns MA1 and MA2. The hole HO may be formed to overlap with the symmetry point of the one mark pattern. As an example, FIG. 8A shows that the hole HO is defined to be adjacent to the first mark pattern MA1 and overlapping with the first symmetry point C1, but the present disclosure is not limited thereto. In this case, the center point of the hole HO may correspond to the first symmetry point C1 of the first mark pattern MA1.

The hole HO may be defined to be spaced apart from the recess portions HF1, HF2, HF3, and HF4, but the present disclosure is not limited thereto or thereby. According to an embodiment, the hole HO may be defined to overlap with at least one recess portion. FIG. 8A shows that the hole HO is spaced apart from the first, second, third, and fourth recess portions HF1, HF2, HF3, and HF4 included in the first mark pattern MA1 when viewed in a plane (e.g., in a plan view), as an example.

Referring to FIG. 8B, the recess portions HF1, HF2, HF3, and HF4 may be portions that are recessed from the upper surface MSB-U of the body portion MSB. Each of the recess portions HF1, HF2, HF3, and HF4 may be formed by a half-etching process. The body portion MSB overlapping with the recess portions HF1, HF2, HF3, and HF4 may have a thickness DI1 that is smaller than a thickness DI2 of the body portion MSB that does not overlap with the recess portions HF1, HF2, HF3, and HF4.

Referring to FIG. 8C, the recess portions HF1, HF2, HF3, and HF4 may be portions that are recessed from the lower surface MSB-B of the body portion MSB. The recess portions HF1, HF2, HF3, and HF4 that are recessed from the lower surface MSB-B of the body portion MSB may also be formed by a half-etching process. Similar to the embodiment described above with reference to FIG. 8B, the body portion MSB overlapping with the recess portions HF1, HF2, HF3, and HF4 may have a thickness DI3 that is smaller than the thickness DI2 of the body portion MSB that does not overlap with the recess portions HF1, HF2, HF3, and HF4.

Referring to FIGS. 8A and 8B, the hole HO may be defined through the body portion MSB. The hole HO may be spaced apart from the recess portions HF1, HF2, HF3, and HF4. Referring to FIG. 8B, a thickness of the body portion MSB adjacent to the hole HO may be greater than the thickness DI1 of the body portion MSB overlapping with the recess portions HF1, HF2, HF3, and HF4.

The frame opening OP-F defined through the frame FM may overlap with the hole HO and the cell openings OP-M1 when viewed in a plane (e.g., in a plan view). The deposition vapor DM ejected from the deposition source DS in the deposition process may be deposited on the target substrate WS after passing through the frame opening OP-F, the hole HO, and the cell openings OP-M1.

A direction in which a laser beam is irradiated to form the hole HO may vary depending on a reference plane of the body portion MSB from which the recess portions HF1, HF2, HF3, and HF4 are disposed. For example, when the recess portions HF1, HF2, HF3, and HF4 are recessed from the upper surface MSB-U of the body portion MSB as shown in FIG. 8B, the laser beam may be irradiated onto the upper surface MSB-U. When the recess portions HF1, HF2, HF3, and HF4 are recessed from the lower surface MSB-B of the body portion MSB as shown in FIG. 8C, the laser beam may be irradiated onto the lower surface MSB-B.

Figure 9A:
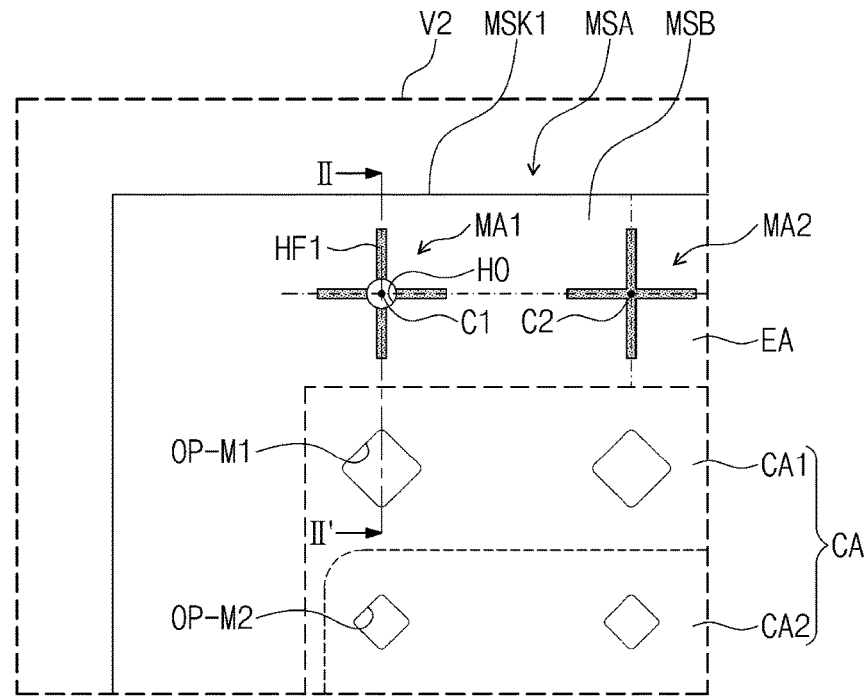
FIG. 9A is a plan view showing a portion of the mask assembly shown in FIG. 6 according to an embodiment of the present disclosure.
Figure 9B:
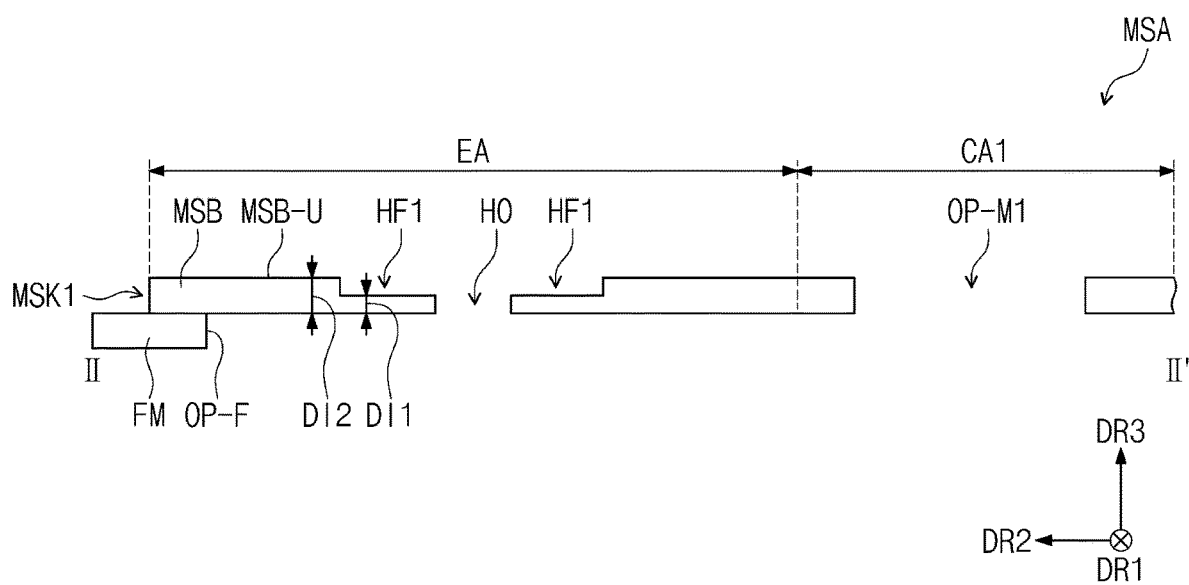
FIG. 9B is a cross-sectional view taken along the line II-II' of FIG. 9A to show a mask assembly according to an embodiment of the present disclosure.
Figure 9C:
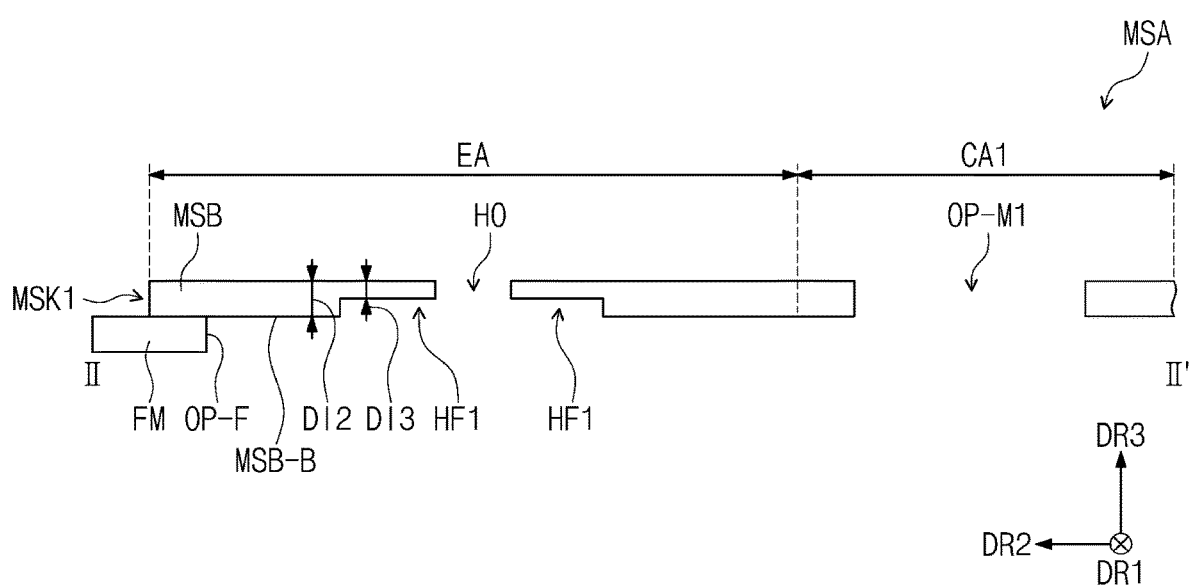
FIG. 9C is a cross-sectional view taken along the line II-II' of FIG. 9A to show a mask assembly according to an embodiment of the present disclosure.

FIG. 9A is an enlarged plan view showing a mask assembly corresponding to the portion V2 shown in FIG. 6 according to an embodiment of the present disclosure. FIGS. 9B and 9C are cross-sectional views taken along the line II-II' of FIG. 9A to show a mask assembly according to various embodiments of the present disclosure. The mask assembly shown in FIG. 9A may have the same or substantially the same configuration as that of the mask assembly shown in FIG. 8A, except the shape of the mark patterns may be different. Accordingly, redundant description thereof may not be repeated.

Referring to FIG. 9A, each of the mark patterns MA1 and MA2 may include one recess portion HF1 having a single unitary shape. As an example, a cross-shaped recess portion HF1 where a bar extending in the first direction DR1 crosses (e.g., intersects with) a bar extending in the second direction DR2 is shown in FIG. 9A.

The recess portion HF1 may have a closed-curve shape when viewed in a plane (e.g., in a plan view). The shape of the recess portion HF1 is not particularly limited as long as the recess portion HF1 indicates a position at which the hole HO is formed. The recess portion HF1 may have the point-symmetrical shape with respect to the symmetry point of the mark pattern. As an example, the recess portion HF1 included in the first mark pattern MA1 may have the point-symmetrical shape with respect to the first symmetry point C1. The recess portion HF1 may overlap with the first symmetry point C1.

The hole HO may be defined to overlap with the recess portion HF1. In other words, the hole HO may be defined through a portion of the body portion MSB overlapping with the recess portion HF1. Referring to FIGS. 9B and 9C, the hole HO may be provided integrally with the recess portion HF1. The hole HO may be connected integrally to the recess portion HF1. The recess portion HF1 shown in FIG. 9B may be recessed from the upper surface MSB-U of the body portion MSB, and may be provided integrally with the hole HO. The recess portion HF1 shown in FIG. 9C may be recessed from the lower surface MSB-B of the body portion MSB, and may be provided integrally with the hole HO. Referring to FIG. 9B, the body portion MSB adjacent to the hole HO may have a thickness DI1 that is smaller than a thickness DI2 of the body portion MSB that does not overlap with the recess portion HF1.

The number and/or shape of the recess portions that form the mark patterns MA1 and MA2 may be variously modified as needed or desired. The shapes of the mark patterns MA1 and MA2 shown in FIGS. 8A and 9A are provided merely as an example, and the present disclosure is not particularly limited thereto, as long as the mark patterns MA1 and MA2 may indicate the position where the hole HO is formed.

FIGS. 10A to 10F are plan views showing masks according to various embodiments. Each of FIGS. 10A to 10F shows a masks MSK-C before the mask assembly MSA is formed.

The mark patterns MA1 and MA2 included in the mask MSK-C may have a variety of suitable shapes. The shape of the mark patterns MA1 and MA2 may be variously modified according to (e.g., depending on) a shape of the recess portions that form the mark patterns MA1 and MA2. FIGS. 10A to 10F show examples of the mark patterns MA1 and MA2 having various suitable shapes according to various embodiments. However, the shapes of the mark patterns MA1 and MA2 are not limited thereto or thereby.

In more detail, FIGS. 10A to 10F show a first mark pattern MA1 and a second mark pattern MA2, which have the same or substantially the same shape as each other, but the present disclosure is not limited thereto or thereby. According to an embodiment, the first mark pattern MA1 and the second mark pattern MA2 may have different shapes from each other.

Referring to FIGS. 10A to 10E, the first mark pattern MA1 and the second mark pattern MA2 may be spaced apart from each other in one direction, but the present disclosure is not limited thereto or thereby. As shown in FIG. 10F, the first mark pattern MA1 and the second mark pattern MA2 may indicate different positions where holes are formed, and may be connected to each other by a recess pattern.

Figure 10A:
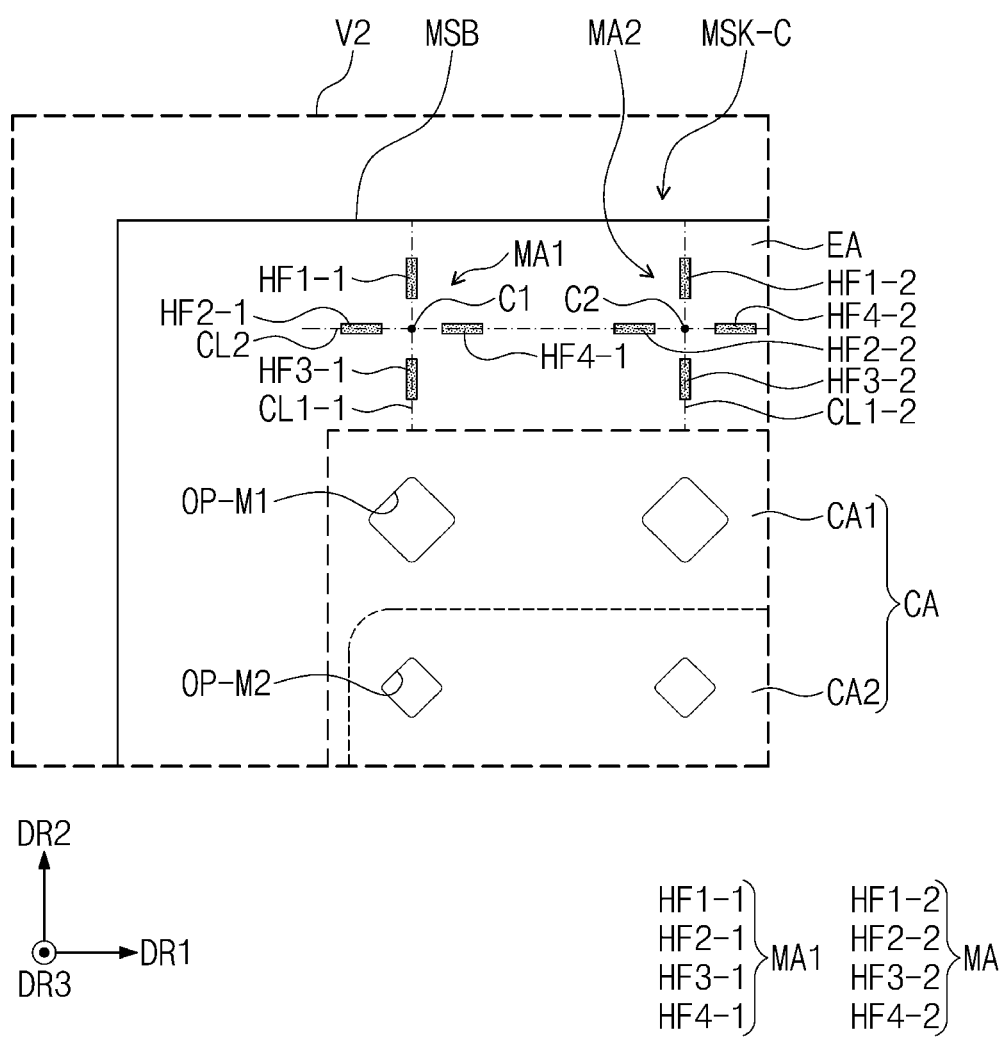
FIGS. 10A-10F are plan views showing masks according to various embodiments of the present disclosure.
Figure 10B:
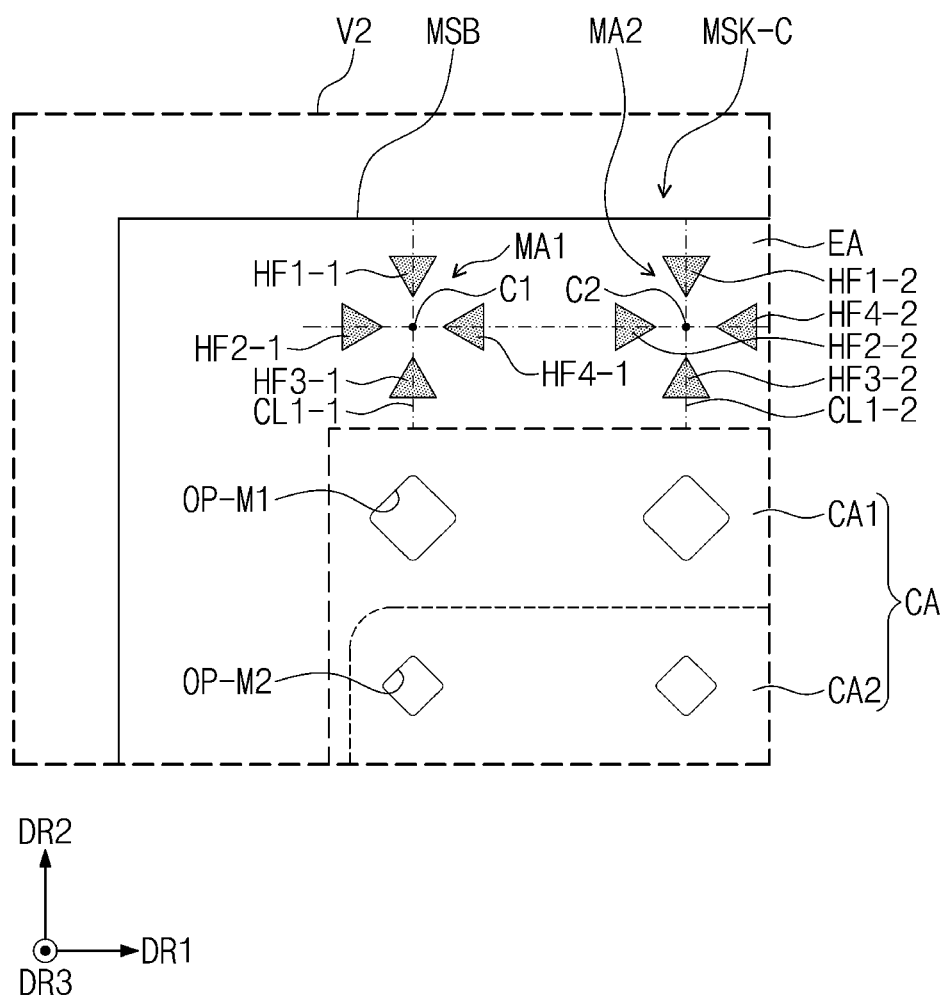
Figure 10C:
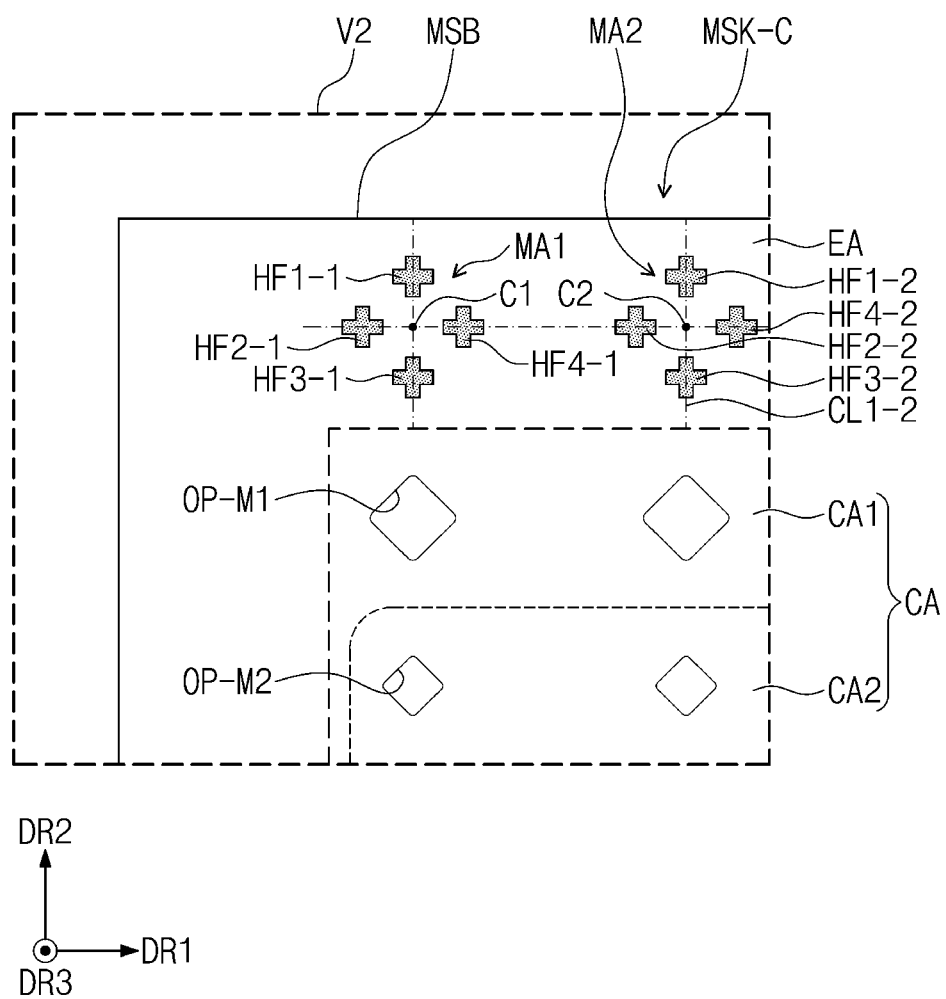
Figure 10D:
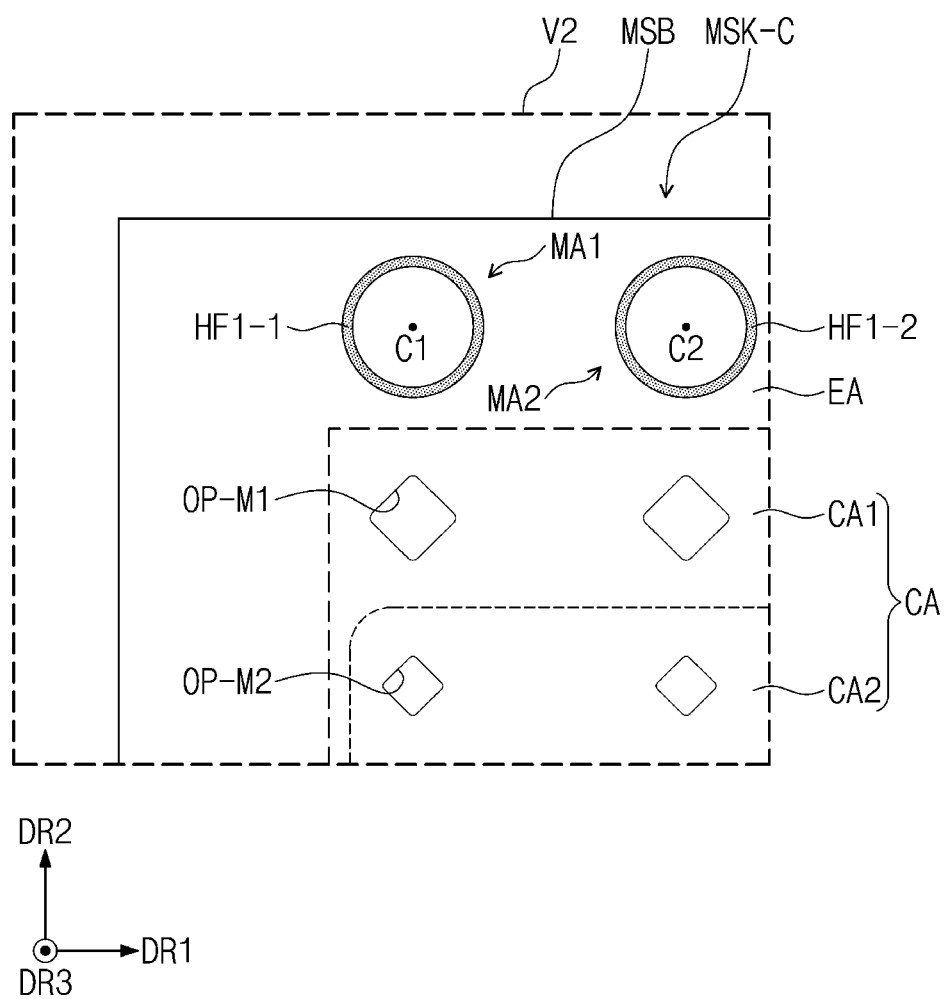
Figure 10E:
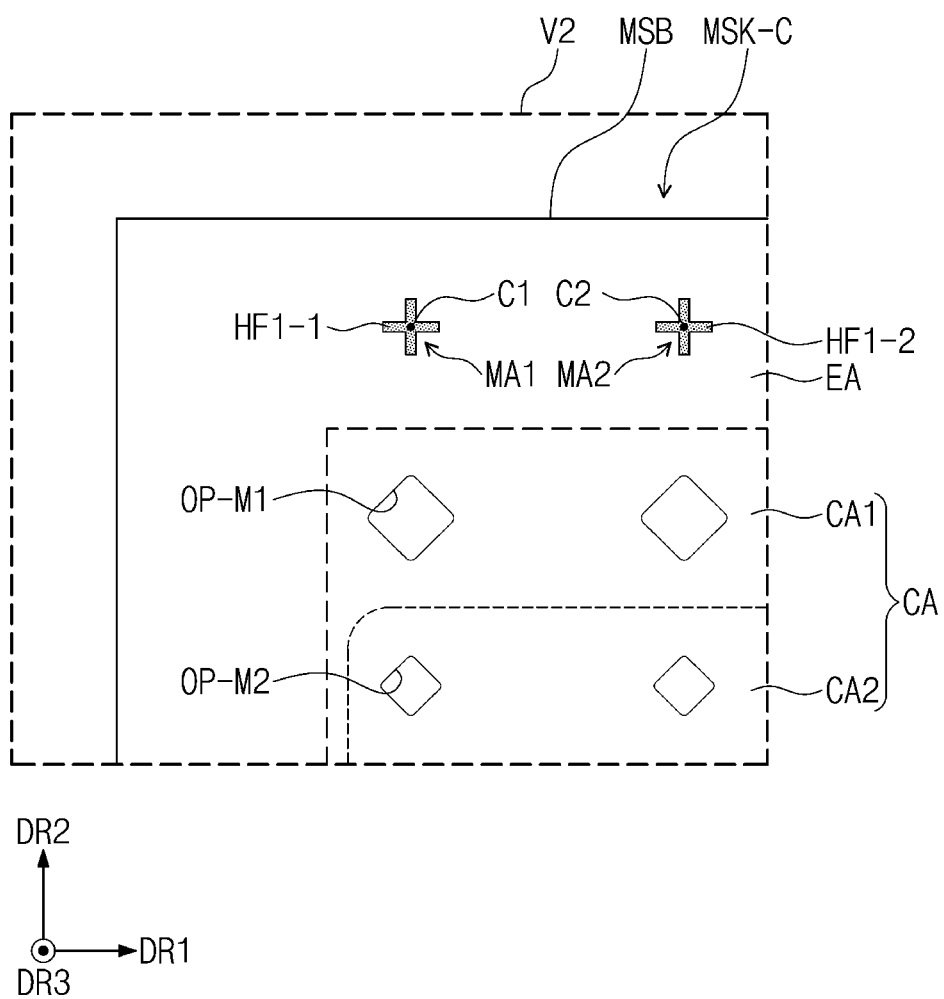
Figure 10F:
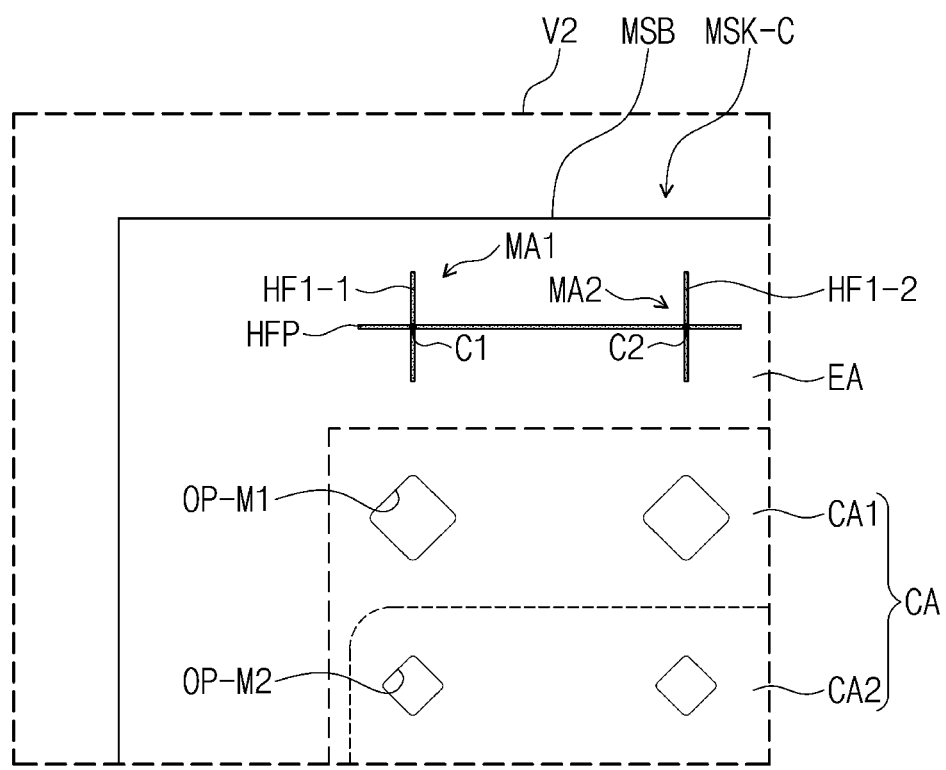

Referring to FIGS. 10A to 10C, each of the first mark pattern MA1 and the second mark pattern MA2 may include a plurality of recess portions. Referring to FIGS. 10D and 10E, each of the first mark pattern MA1 and the second mark pattern MA2 may include one recess portion.

Referring to FIG. 10A, the first mark pattern MA1 may include first to fourth recess portions HF1-1, HF2-1, HF3-1, and HF4-1 having a point-symmetrical relationship, and the second mark pattern MA2 may include first to fourth recess portions HF1-2, HF2-2, HF3-2, and HF4-2 having a point-symmetrical relationship.

Each of the first to fourth recess portions HF1-1 to HF4-1 and HF1-2 to HF4-2 of the first mark pattern MA1 and the second mark pattern MA2 may have a quadrangular shape having long sides extending in one direction. Each of the first and third recess portions HF1-1, HF3-1, HF1-2, and HF-3-2 may have a quadrangular shape having long sides extending in the second direction DR2, and each of the second and fourth recess portions HF2-1, HF4-1, HF2-2, and HF4-2 may have a quadrangular shape having long sides extending in the first direction DR1.

Similar to the first mark pattern MA1 described above with reference to FIG. 8A, the first recess portion HF1-2 and the third recess portion HF3-2 of the second mark pattern MA2 may have the symmetrical relationship with respect to a second symmetry point C2 in the second direction DR2. The second recess portion HF2-2 and the fourth recess portion HF4-2 of the second mark pattern MA2 may have the symmetrical relationship with respect to the second symmetry point C2 in the first direction DR1.

A center line CL2 of the second and fourth recess portions HF2-1 and HF4-1 of the first mark pattern MA1 and a center line CL2 of the second and fourth recess portions HF2-2 and HF4-2 of the second mark pattern MA2 may extend in the first direction DR1, and may be defined to be on the same line as each other.

In the first mark pattern MA1, the first symmetry point C1 may correspond to a point where a center line CL1-1 of the first and third recess portions HF1-1 and HF3-1 crosses (e.g., intersects with) the center line CL2 of the second and fourth recess portions HF2-1 and HF4-1. In the second mark pattern MA2, the second symmetry point C2 may correspond to a point where a center line CL1-2 of the first and third recess portions HF1-2 and HF3-2 crosses (e.g., intersects with) the center line CL2 of the second and fourth recess portions HF2-2 and HF4-2.

The mark patterns MA1 and MA2 shown in FIGS. 10B and 10C may be the same or substantially the same as the mark patterns MA1 and MA2 described above with reference to FIG. 10A, except for the shape of the recess portions thereof. Accordingly, redundant description thereof may not be repeated.

Referring to FIG. 10B, each of first to fourth recess portions HF1-1 to HF4-1 and HF1-2 to HF4-2 of the first mark pattern MA1 and the second mark pattern MA2 may have a triangular shape when viewed in a plane (e.g., in a plan view). Vertices of the first recess portions HF1-1 and HF1-2 may face vertices of the third recess portions HF3-1 and HF3-2 in the second direction DR2, respectively. Vertices of the second recess portions HF2-1 and HF2-2 may face vertices of the fourth recess portions HF4-1 and HF4-2 in the first direction DR1, respectively.

Referring to FIG. 10C, each of first to fourth recess portions HF1-1 to HF4-1 of the first mark pattern MA1 and each of first to fourth recess portions HF1-2 to HF4-2 of the second mark pattern MA2 may have a cross shape when viewed in a plane (e.g., in a plan view). The first to fourth recess portions HF1-1 to HF4-1 and HF1-2 to HF4-2 may have the same or substantially the same area as each other.

Referring to FIGS. 10D and 10E, the first mark pattern MA1 and the second mark pattern MA2 may include first recess portions HF1-1 and HF1-2 having a point-symmetrical shape with respect to symmetry points C1 and C2, respectively.

Referring to FIG. 10D, each of the first recess portions HF1-1 and HF1-2 may have a ring shape when viewed in a plane (e.g., in a plan view). The first recess portions HF1-1 and HF1-2 may have the ring shape surrounding (e.g., around a periphery of) the symmetry points C1 and C2, respectively. As an example, FIG. 10D shows the first recess portion HF1-1 of the first mark pattern MA1, which has the point-symmetry circular ring shape with respect to the first symmetry point C1, and the first recess portion HF1-2 of the second mark pattern MA2, which has the point-symmetry circular ring shape with respect to the second symmetry point C2. However, the present disclosure is not limited thereto, and the first recess portions HF1-1 and HF1-2 may have a polygonal ring shape, for example, such as a quadrangular ring shape, but the shape of the first recess portions HF1-1 and HF1-2 are not particularly limited as long as the first recess portions HF1-1 and HF1-2 have the point-symmetrical shape.

Referring to FIG. 10E, each of first recess portions HF1-1 and HF1-2 may have a polygonal shape. The first recess portion HF1-1 of the first mark pattern MA1 may have a point-symmetrical shape with respect to a first symmetry point C1, and may overlap with the first symmetry point C1. The first recess portion HF1-2 of the second mark pattern MA2 may have a point-symmetrical shape with respect to a second symmetry point C2, and may overlap with the second symmetry point C2. The shape of the first recess portions HF1-1 and HF1-2 are not particularly limited as long as the first recess portions HF1-1 and HF1-2 have the polygonal shape with the point-symmetrical shape.

Referring to FIG. 10F, the first mark pattern MA1 and the second mark pattern MA2 may be connected to each other. A first recess portion HF1-1 of the first mark pattern MA1 may have a bar shape having a point-symmetrical shape with respect to a first symmetry point C1, and extends in the second direction DR2. A first recess portion HF1-2 of the second mark pattern MA2 may be spaced apart from the first recess portion HF1-1 of the first mark pattern MA1, and may have a bar shape extending in the second direction DR2. The first recess portion HF1-2 of the second mark pattern MA2 may have a point-symmetrical shape with respect to a second symmetry point C2.

The mask MSK-C of the embodiment shown in FIG. 10F may include a recess pattern HFP. The first recess portion HF1-1 of the first mark pattern MA1 may overlap with the first symmetry point C1, and the first recess portion HF1-2 of the second mark pattern MA2 may overlap with the second symmetry point C2. The recess pattern HFP may extend in the first direction DR1, and may connect the first mark pattern MA1 and the second mark pattern MA2 to each other. The recess pattern HFP may overlap with the first symmetry point C1 and the second symmetry point C2.

The first and second symmetry points C1 and C2 shown in FIGS. 10A to 10F may be indicators that indicate the positions where the hole HO is formed. The hole HO may be defined to overlap with the first symmetry point C1 or the second symmetry point C2. The positions where the hole HO is formed on the mask MSK-C may vary depending on the type of the light emitting pattern that is to be deposited using the mask MSK-C, and the user may selectively determine the positions of the hole HO.

Hereinafter, a method of manufacturing the display panel will be described in more detail. In the following embodiments, the same or substantially the same description of the components described above may be applied hereinafter, any redundant description thereof may not be repeated, and processes of the manufacturing method of the display panel will be described in more detail.

Figure 11:
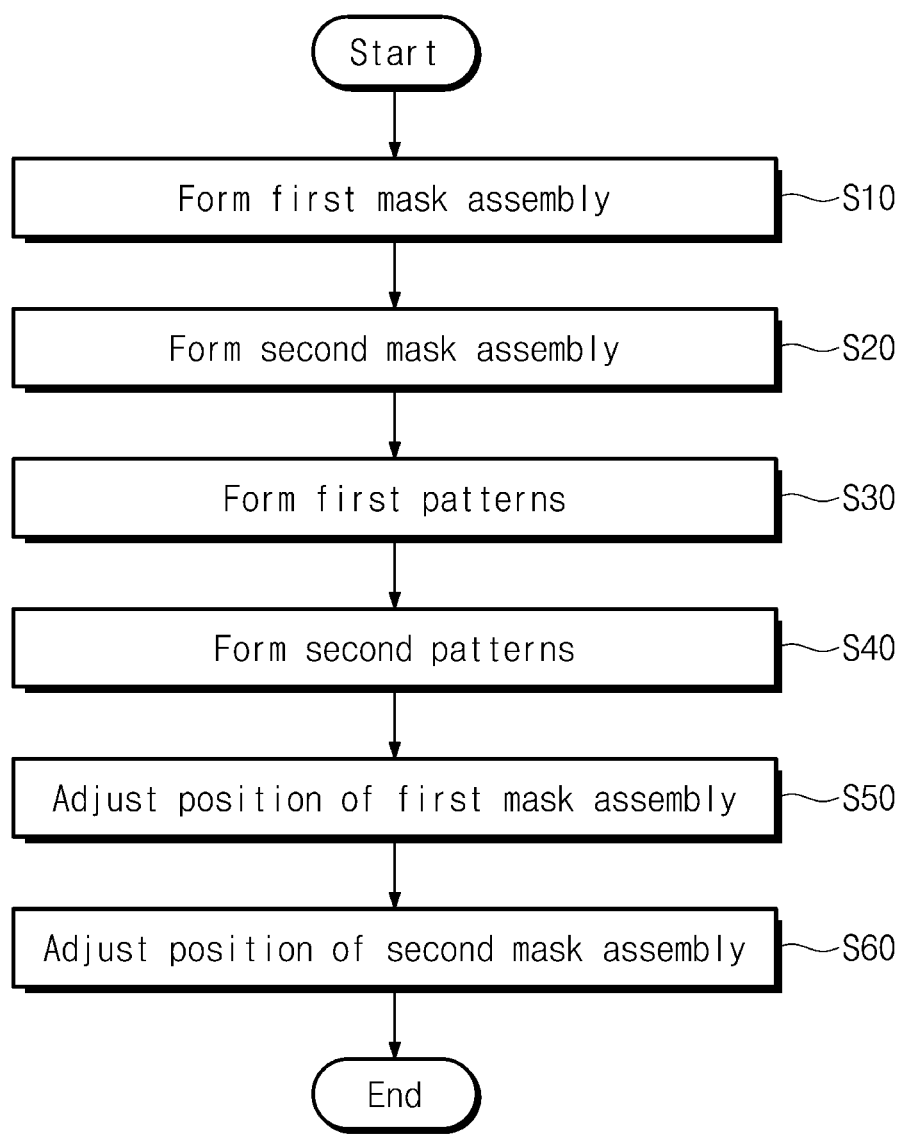
FIG. 11 is a flowchart showing a method of manufacturing a display panel according to an embodiment of the present disclosure.

FIG. 11 is a flowchart showing the manufacturing method of the display panel according to an embodiment. The manufacturing method of the display panel may include forming a first mask assembly (S10), forming a second mask assembly (S20), forming first patterns (S30), forming second patterns (S40), adjusting a position of the first mask assembly (S50), and adjusting a position of the second mask assembly (S60).

Figure 12:
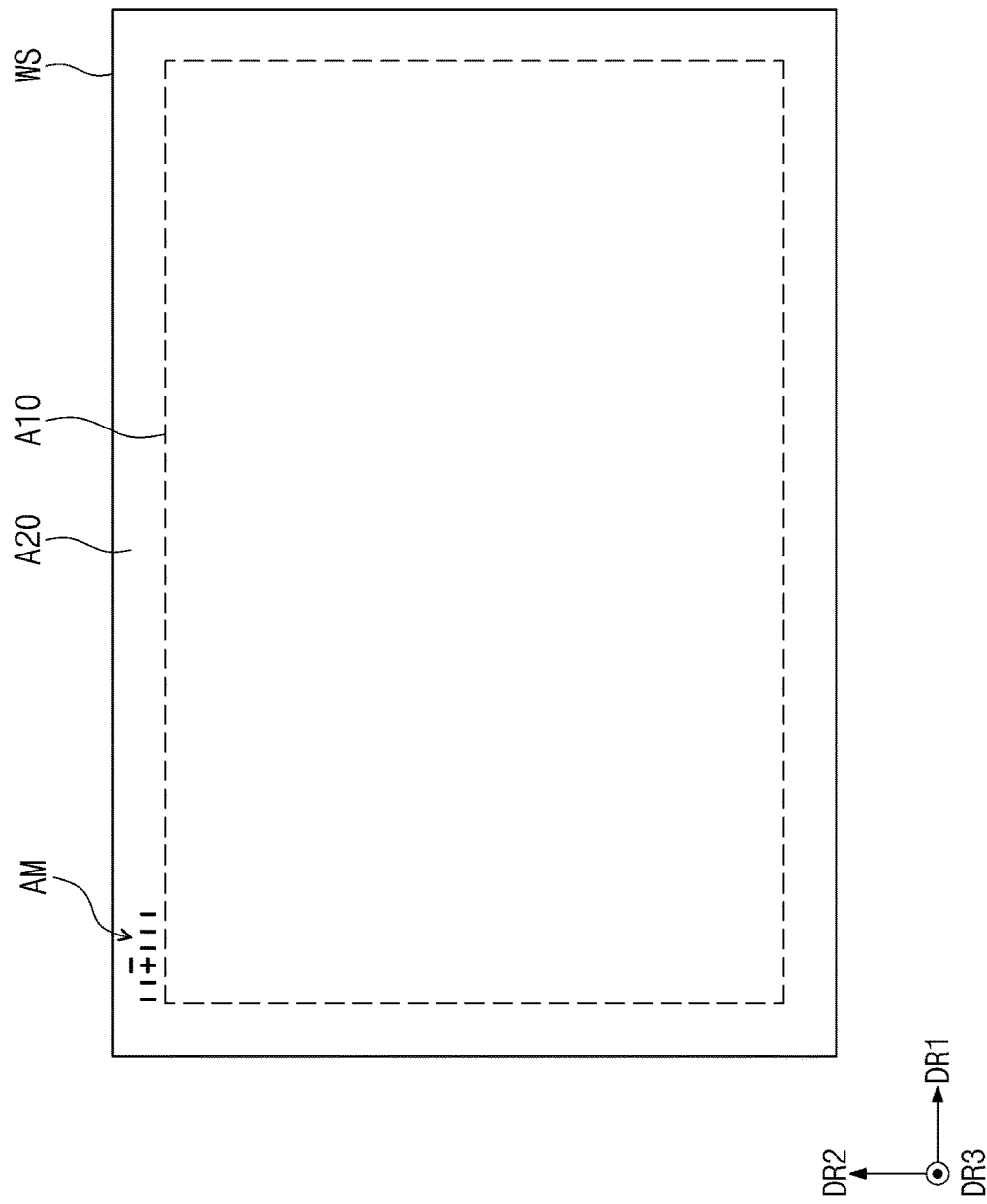
FIG. 12 is a plan view showing a target substrate according to an embodiment of the present disclosure.

FIG. 12 is a plan view showing a target substrate according to an embodiment. FIG. 12 shows the target substrate WS that is to be disposed in the deposition apparatus DPA (e.g., refer to FIG. 5) when the display panel is manufactured. A deposition surface of the target substrate WS may be parallel or substantially parallel to a surface defined by the first direction DR1 and the second direction DR2. The target substrate WS may include an alignment mark AM.

The deposition surface of the target substrate WS may include a first substrate area A10 on which the light emitting pattern is to be deposited, and a second substrate area A20 adjacent to the first substrate area A10. The first substrate area A10 of the target substrate WS may be an area at (e.g., in or on) which the circuit element layer DP-CL (e.g., refer to FIG. 4), the electrode of the light emitting element OL, and the pixel definition layer PDL are disposed in the deposition process of the light emitting pattern.

The second substrate area A20 may surround (e.g., around a periphery of) the first substrate area A10. The alignment mark AM may be disposed at (e.g., in or on) the second substrate area A20. The second substrate area A20 may overlap with the peripheral area EA of the mask MSK on the mask assembly MSA. The second substrate area A20 may be an area at (e.g., in or on) which the test thin film described in more detail below is formed.

The alignment mark AM may be used to align a position of the mask assembly MSA with a position of the target substrate WS according to its position relationship with the hole HO defined through the mask MSK. In addition, the alignment mark AM may be used to correct the alignment between the mask assembly MSA and the target substrate WS according to its position relationship with the test thin film formed on the second substrate area A20.

Figure 13A:
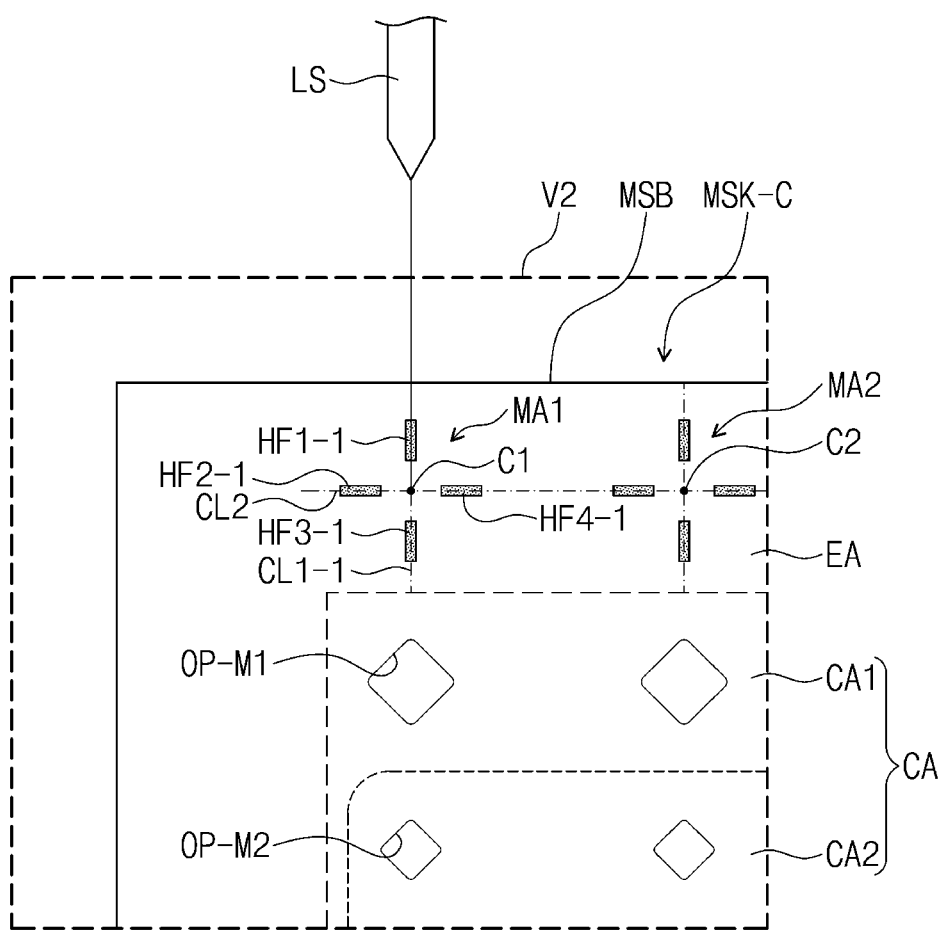
FIGS. 13A-13B are plan views showing a method of manufacturing a display panel according to an embodiment of the present disclosure.
Figure 13B:
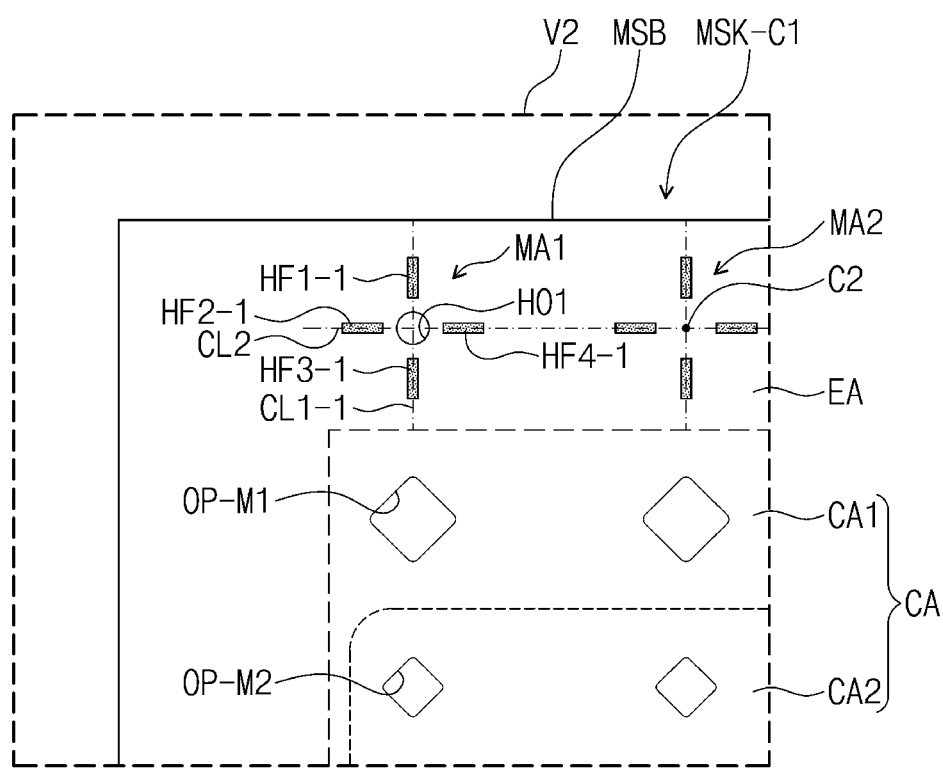
Figure 13C:
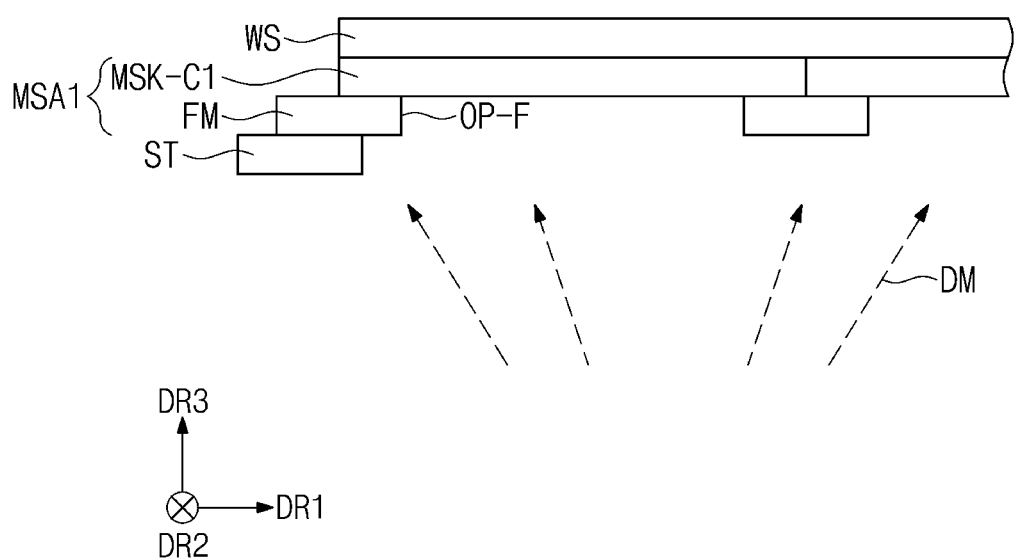
FIG. 13C is a cross-sectional view showing a method of manufacturing a display panel according to an embodiment of the present disclosure.
Figure 13D:
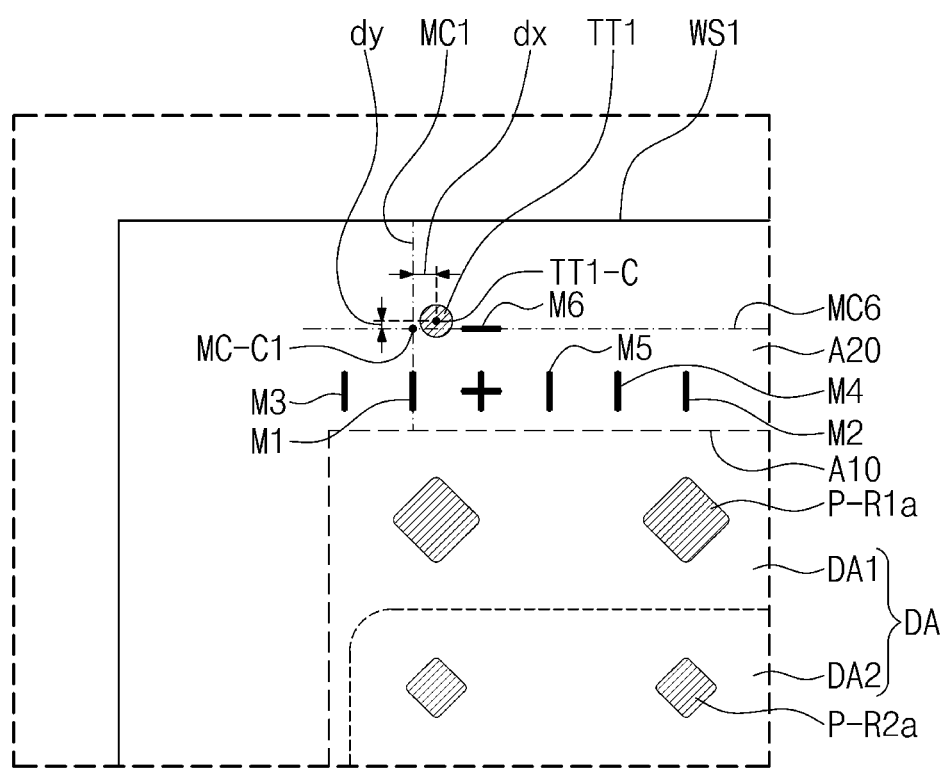
FIG. 13D is a plan view showing a method of manufacturing a display panel according to an embodiment of the present disclosure.
Figure 14A:
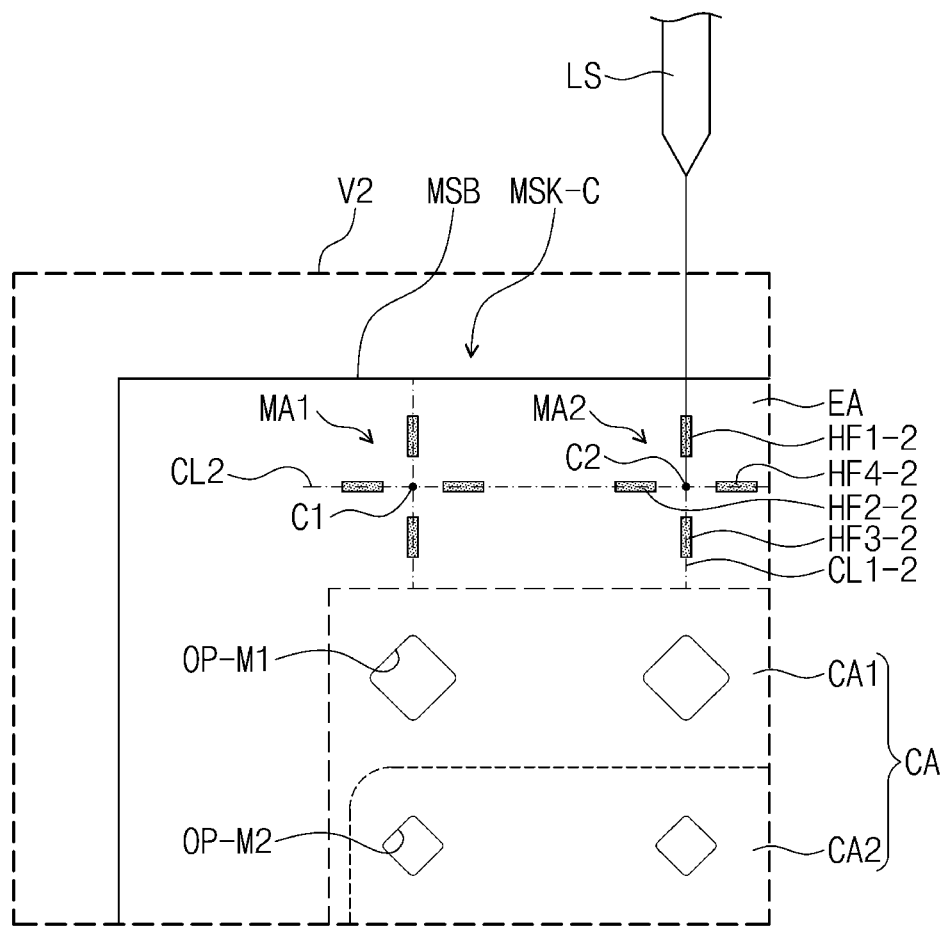
FIGS. 14A-14C are plan views showing a method of manufacturing a display panel according to an embodiment of the present disclosure.
Figure 14A:
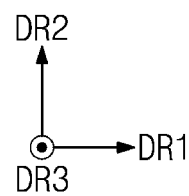
Figure 14B:
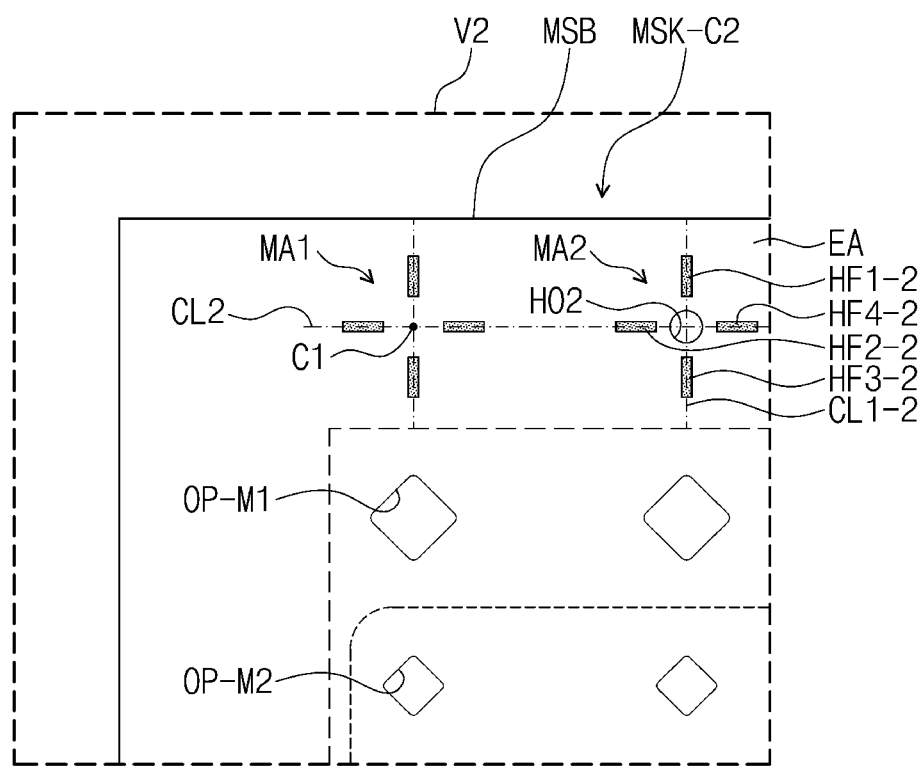
Figure 14C:
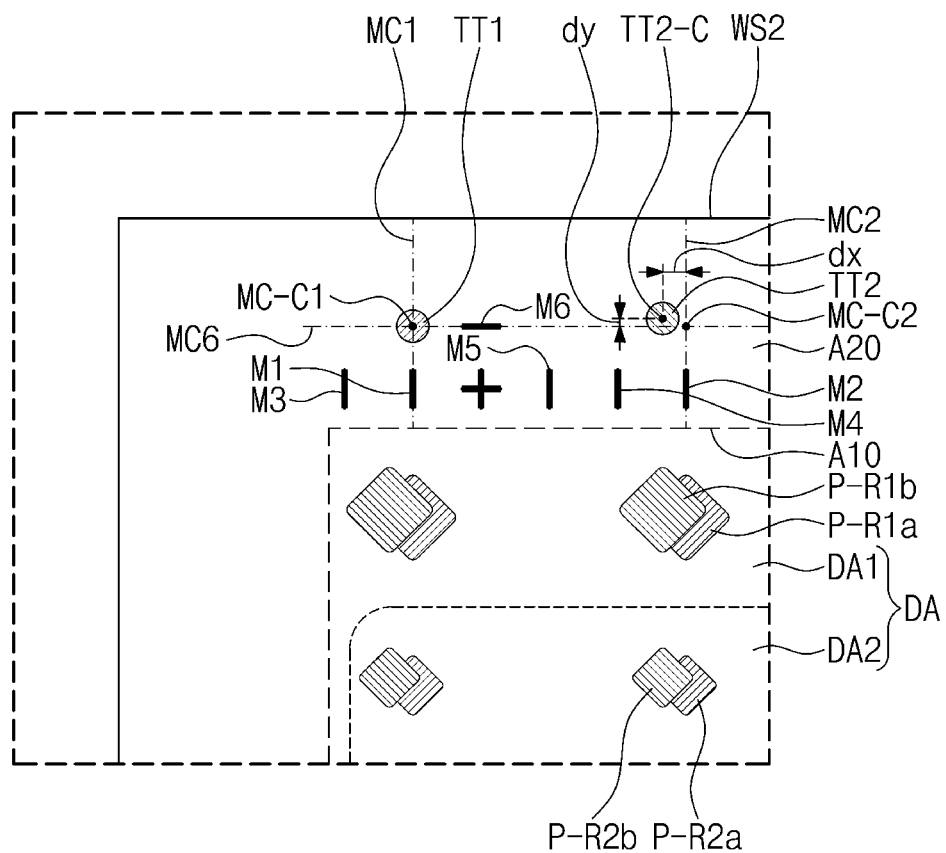

FIGS. 13A, 13B, and 13D are plan views showing various processes of the manufacturing method of the display panel using the first mask assembly according to an embodiment of the present disclosure, and FIG. 13C is a cross-sectional view showing a process of the manufacturing method of the display panel according to an embodiment of the present disclosure. FIGS. 14A to 14C are plan views showing various processes of the manufacturing method of the display panel using the second mask assembly according to an embodiment of the present disclosure.

The first mask assembly may be formed by connecting (e.g., coupling or attaching) a first mask and a first frame to each other. First group cell openings, first group mark patterns that are spaced apart from the first group cell openings, and a first hole may be defined in the first mask of the first mask assembly. The second mask assembly may be formed by connecting (e.g., coupling or attaching) a second mask and a second frame to each other. Second group cell openings, second group mark patterns that are spaced from the second group cell openings, and a second hole may be defined in the second mask of the second mask assembly.

Any suitable above described cell openings may be applied to the first group cell openings and the second group cell openings, and any suitable above described mark patterns may be applied to the first group mark patterns and the second group mark patterns. These components are referred to as the first group and the second group to distinguish between the components included in the separate masks. Each of the first frame and the second frame may be referred to as a frame.

Referring to FIGS. 13A to 13C, the forming of the first mask assembly MSA1 may include manufacturing a first mask MSK-C1, forming a first hole HO1, and tensioning the first mask MSK-C1 to connect (e.g., to couple or to attach) the first mask MSK-C1 to the frame MF.

Referring to FIGS. 14A and 14B, the forming of the second mask assembly may include manufacturing a second mask MSK-C2, forming a second hole HO2, and tensioning the second mask MSK-C2 to connect (e.g., to couple or to attach) the second mask MSK-C2 to the frame MF.

The position and the shape of the cell openings OP-M1 and OP-M2 of the first mask MSK-C1 may be the same as those of the cell openings OP-M1 and OP-M2 of the second mask MSK-C2, and the positions of the holes HO1 and HO2 of the first mask MSK-C1 and the second mask MSK-C2 may be different from each other.

The manufacturing of the first mask MSK-C1 may include forming the cell openings OP-M1 and OP-M2 and the mark patterns MA1 and MA2 in the body portion MSB of the mask MSK-C. The manufacturing of the second mask MSK-C2 may include forming the cell openings OP-M1 and OP-M2 and the mark patterns MA1 and MA2, which use the same or substantially the same processes as those of the manufacturing of the first mask MSK-C1. Accordingly, the first mask MSK-C1 and the second mask MSK-C2 may include the same or substantially the same cell openings OP-M1 and OP-M2 and the same or substantially the same mark patterns MA1 and MA2 as each other.

Referring to FIGS. 13A and 14A, the first cell openings OP-M1 may be formed at (e.g., in or on) the first area CA1 of the mask MSK-C. The second cell openings OP-M2, which may be different from the first cell openings OP-M1, may be formed at (e.g., in or on) the second area CA2 adjacent to the first area CA1. The mask MSK-C may include the mark patterns MA1 and MA2 formed at (e.g., in or on) the peripheral area EA.

The first cell openings OP-M1 and the second cell openings OP-M2 may be formed through the body portion MSB of the mask MSK-C by the etching process. For example, the first cell openings OP-M1 and the second cell openings OP-M2 may be formed by a photolithography process.

The mark patterns MA1 and MA2 may be formed to be recessed from the upper surface MSB-U or the lower surface MSB-B of the body portion MSB of the mask MSK-C by the half-etching process. The mark patterns MA1 and MA2 may be concurrently (e.g., simultaneously or substantially simultaneously) formed when the first cell openings OP-M1 and the second cell openings OP-M2 are formed. For example, the mark patterns MA1 and MA2 and the cell openings OP-M1 and OP-M2 may be formed by varying a degree to which the body portion MSB is etched in a photolithography process, but the present disclosure is not limited thereto or thereby. According to an embodiment, the mark patterns MA1 and MA2 may be formed after the first cell openings OP-M1 and the second cell openings OP-M2 are formed.

After the cell openings OP-M1 and OP-M2 and the mark patterns MA1 and MA2 are formed, the hole may be formed to be adjacent to one mark pattern from among the mark patterns MA1 and MA2 of the mask MSK-C by irradiating a laser beam LS onto one symmetry point from among the symmetry points. The position at which the hole is formed may vary according to the position to which the laser beam is irradiated, and the first mask MSK-C1 and the second mask MSK-C2 may be classified according to the position of the hole.

FIG. 13A is a plan view showing a process of forming the first hole HO1, and FIG. 13B is a plan view showing the first mask MSK-C1 through which the first hole HO1 is formed. FIG. 14A is a plan view showing a process of forming the second hole HO2, and FIG. 14B is a plan view showing the second mask MSK-C2 through which the second hole HO2 is formed.

Referring to FIGS. 13A and 13B, the first hole HO1 may be formed by irradiating the laser beam LS onto the first symmetry point C1 that is a symmetrical reference point of the shape of the first mark pattern MA1. The first hole HO1 may overlap with the first symmetry point C1, and may be formed to be adjacent to the first mark pattern MA1. The first hole HO1 may be spaced apart from the second symmetry point C2.

Referring to FIGS. 14A and 14B, the second hole HO2 may be formed by irradiating the laser beam LS onto the second symmetry point C2 that is a symmetrical reference point of the shape of the second mark pattern MA2. The second hole HO2 may overlap with the second symmetry point C2, and may be formed to be adjacent to the second mark pattern MA2. The second hole HO2 may be spaced apart from the first symmetry point C1. Accordingly, the first mask MSK-C1 may include the same cell openings OP-M1 and OP-M2 as those of the second mask MSK-C2, and may include the first hole HO1 formed at a position different from that of the second hole HO2 of the second mask MSK-C2.

After the first hole HO1 is formed, the first mask MSK-C1 may be connected to (e.g., coupled to or attached to) the frame MF after being tensioned, however, the present disclosure is not limited thereto or thereby. For example, according to an embodiment, after the mask MSK-C is tensioned and connected to (e.g., coupled to or attached to) the frame MF, the first hole HO1 may be formed to form the first mask assembly MSA1. Similarly, after the second hole HO2 is formed, the second mask MSK-C2 may be tensioned and connected to (e.g., coupled to or attached to) the frame MF. However, the present disclosure is not limited thereto, and according to an embodiment, after the mask MSK-C is tensioned and coupled to the frame MF, the first hole HO1 may be formed to form the first mask assembly MSA1, or the second hole HO2 may be formed to form the second mask assembly MSA2.

FIG. 13C is a cross-sectional view showing a process of depositing the light emitting pattern. FIG. 13C shows the first mask assembly MSA1 including the first mask MSK-C1 as a representative example.

The first mask assembly MSA1 may be disposed on the stage ST in the deposition apparatus DPA (e.g., refer to FIG. 5). Then, the target substrate WS may be disposed on the first mask assembly MSA1. The first mask assembly MSA1 may be aligned with the target substrate WS, such that a center of the first hole HO1 of the first mask MSK-C1 coincides with the reference point defined in the alignment mark AM of the target substrate WS.

When the first mask assembly MSA1 is aligned with the target substrate WS, the deposition vapor DM may be deposited on the target substrate WS, and thus, the light emitting layer EML having the above-described shape of the light emitting pattern may be formed. The shape of the light emitting pattern may correspond to the shape of the cell openings OP-M1 and OP-M2.

Test thin films, which will be described in more detail below, may be concurrently (e.g., simultaneously or substantially simultaneously) formed with the light emitting layer EML. The test thin films may be formed by depositing the deposition vapor DM on the target substrate WS via the hole of the mask.

FIG. 13D is a plan view showing a first target substrate WS1 at (e.g., in or on) which the first light emitting pattern is formed after the deposition process shown in FIG. 13C is performed. The first target substrate WS1 may correspond to the target substrate WS on which a first light emitting pattern P-Ra is formed to overlap with the first substrate area A10.

Referring to FIG. 13D, the first light emitting pattern P-Ra may have different shapes for different display areas. The first light emitting pattern P-R1a formed at (e.g., in or on) the first display area DA1 may correspond to the shape of the first cell opening OP-M1 of the first mask MSK-C1. The first light emitting pattern P-R2a formed at (e.g., in or on) the second display area DA2 may correspond to the shape of the second cell opening OP-M2 of the first mask MSK-C1. The shape of the first light emitting pattern P-Ra may correspond to any suitable one of the above-described first light emitting areas P-R1 and P-R2.

The alignment mark AM of the target substrate WS may include a plurality of marks M1 to M6 to define a plurality of reference points. First to fifth marks M1 to M5 may have bar shapes extending in the second direction DR2. The first to fifth marks M1 to M5 may be arranged along the first direction DR1, and may be spaced apart from each other. The sixth mark M6 may have a bar shape extending in the first direction DR1.

The alignment mark AM may be provided with the plurality of reference points defined by the marks M1 to M6. The reference points may indicate positions at which the light emitting pattern is formed on the target substrate. As a corresponding reference point from among the plurality of reference points coincides with the center of the hole of the mask, the light emitting pattern may be formed at an accurate position. FIG. 13D shows a first reference point MC-C1 defined by the first mark M1 and the sixth mark M6.

The first reference point MC-C1 may correspond to a point at which an imaginary center line MC1 of the first mark M1, which extends in the second direction DR2, crosses an imaginary center line MC6 of the sixth mark M6, which extends in the first direction DR1.

The test thin film may be formed on the second substrate area A20 of the target substrate WS in the process of the depositing shown in FIG. 13C. FIG. 13D shows a first test thin film TT1 formed at (e.g., in or on) the second substrate area A20 of the first target substrate WS1. The first test thin film TT1 may be formed to correspond to the first hole HO1 of the first mask MSK-C1 shown in FIG. 13B. The first test thin film TT1 may indicate a deposition position of the first light emitting pattern P-Ra.

After the deposition process, it may be possible to determine whether the first light emitting pattern P-Ra is deposited at an accurate position based on the position of the first test thin film TT1, and the alignment position of the first mask assembly MSA1 may be corrected as needed or desired. In more detail, whether or not the first light emitting pattern P-Ra is deposited at the accurate position may be determined using distances dx and dy in the first direction DR1 and the second direction DR2, respectively, between a center point TT1-C of the first test thin film TT1 and the first reference point MC-C1.

FIG. 13D shows that the first test thin film TT1 is deposited to deviate from the first reference point MC-C1. The first test thin film TT1 is spaced apart from the first reference point MC-C1 by the distance dx in the first direction DR1, and the distance dy in the second direction DR2. Accordingly, based on this deviation, it may be predicted that the first light emitting pattern P-Ra is also deposited to be spaced apart by the distances dx and dy from the accurate position thereof to be deposited. The position of the mask assembly MSA1 may be adjusted based on the distances dx and dy of the first test thin film TT1 that is spaced apart from the first reference point MC-C1 to allow the first light emitting pattern P-Ra to be formed at the accurate position in a subsequent deposition process.

Afterwards, a second pattern including a second light emitting pattern P-Rb and a second test thin film TT2 (e.g., refer to FIG. 14C) may be deposited on the first target substrate WS1 by placing the first target substrate WS1 (on which the first pattern including the first light emitting pattern P-Ra and the first test thin film TT1 is formed) on the second mask assembly.

FIG. 14C is a plan view showing a second target substrate WS2 obtained by forming the second light emitting pattern P-Rb on the first target substrate WS1. The second target substrate WS2 may correspond to the first substrate WS1 on which the first light emitting pattern P-Ra and the second light emitting pattern P-Rb are formed to overlap with the first substrate area A10.

The second light emitting pattern P-Rb may be a light emitting layer deposited on the first light emitting pattern P-Ra. The first light emitting pattern P-Ra and the second light emitting pattern P-Rb may have the same or substantially the same deposition shape and position. The first light emitting pattern P-Ra may correspond to the first light emitting layer EML1, and the second light emitting pattern P-Rb may correspond to the second light emitting layer EML2 formed on the first light emitting layer EML1 (e.g., see FIG. 4).

The first light emitting pattern P-Ra and the second light emitting pattern P-Rb may be light emitting layers that emit lights having the same or substantially the same color as each other, but different wavelength ranges of the emission spectra from each other. For example, the first light emitting pattern P-Ra and the second light emitting pattern P-Rb may be the light emitting layers that emit the lights having the same or substantially the same color as each other, but include different light emitting materials from each other, but the present disclosure is not limited thereto or thereby. According to an embodiment, the first light emitting pattern P-Ra and the second light emitting pattern P-Rb may be light emitting layers that emit lights having different colors from each other, and are sequentially stacked in the third direction DR3.

Similar to the first light emitting pattern P-Ra, the second light emitting pattern P-Rb may have different shapes for different display areas. A second light emitting pattern P-R1b formed at (e.g., in or on) the first display area DA1 may correspond to the shape of the first cell openings OP-M1 of the second mask MSK-C2. A second light emitting pattern P-R2b formed at (e.g., in or on) the second display area DA2 may correspond to the shape of the second cell openings OP-M2 of the second mask MSK-C2. The shape of the second light emitting pattern P-Rb may correspond to those of the first light emitting areas P-R1 and P-R2.

FIG. 14C shows the first reference point MC-C1 defined by the first mark M1 and the sixth mark M6, and a second reference point MC-C2 defined by the second mark M2 and the sixth mark M6. The second reference point MC-C2 may correspond to a point where an imaginary center line MC2 of the second mark M2, which extends in the second direction DR2, crosses with an imaginary center line MC6 of the sixth mark M6, which extends in the first direction DR1.

The second test thin film TT2 may be formed on the second substrate area A20 of the first target substrate WS1 concurrently (e.g., simultaneously or substantially simultaneously) when the second light emitting pattern P-Rb is deposited. The second test thin film TT2 may be formed to correspond to the second hole HO2 of the second mask MSK-C2 shown in FIG. 14B. The second test thin film TT2 may indicate a deposition position of the second light emitting pattern P-Rb.

The second test thin film TT2 may be formed to be spaced apart from the first test thin film TT1. When the second test thin film TT2 is formed to overlap with the first test thin film TT1, it may be difficult to accurately determine the deposition position of the second light emitting pattern P-Rb. Accordingly, the second test thin film TT2 may be formed to be spaced apart from the first test thin film TT1 to determine whether or not the second light emitting pattern P-Rb is formed at an accurate position to overlap with the first light emitting pattern P-Ra.

It may be possible to determine whether the second light emitting pattern P-Rb is deposited at the accurate position based on the position of the second test thin film TT2, and the alignment position of the second mask assembly may be corrected as needed or desired. Whether or not the second light emitting pattern P-Rb is deposited at the accurate position may be determined using distances dx and dy in the first direction DR1 and the second direction DR2, respectively, between the center point TT2-C of the second test thin film TT2 and the second reference point MC-C2.

FIG. 14C shows that the first test thin film TT1 has a center point coinciding with the first reference point MC-C1, and the second test thin film TT2 has a center point TT2-C that does not coincide with the second reference point MC-C2. Accordingly, in this case, it may be determined that the first light emitting pattern P-Ra is deposited at the accurate position based on the first test thin film TT1 having the center point coinciding with the first reference point MC-C1. On the other hand, because the second test thin film TT2 is spaced apart from the second reference point MC-C2 in the first direction DR1 and the second direction DR2 by the distances dx and dy, it may be determined that the second light emitting pattern P-Rb is deposited to be spaced apart from the accurate position by the distances dx and dy. Through the test thin films TT1 and TT2, it may be determined that the first light emitting pattern P-Ra and/or the second light emitting pattern P-Rb, which are desired to be deposited at the same or substantially the same location as each other, are deposited to be spaced apart from the accurate position by the distances dx and dy.

The position of the mask assembly may be adjusted so that the second light emitting pattern P-Rb is formed at the accurate position in a subsequent deposition process according to (e.g., based on) the separation distances dx and dy between the second test thin film TT2 and the second reference point MC-C2. Accordingly, reliability of the deposition process may be improved.

Figure 15:
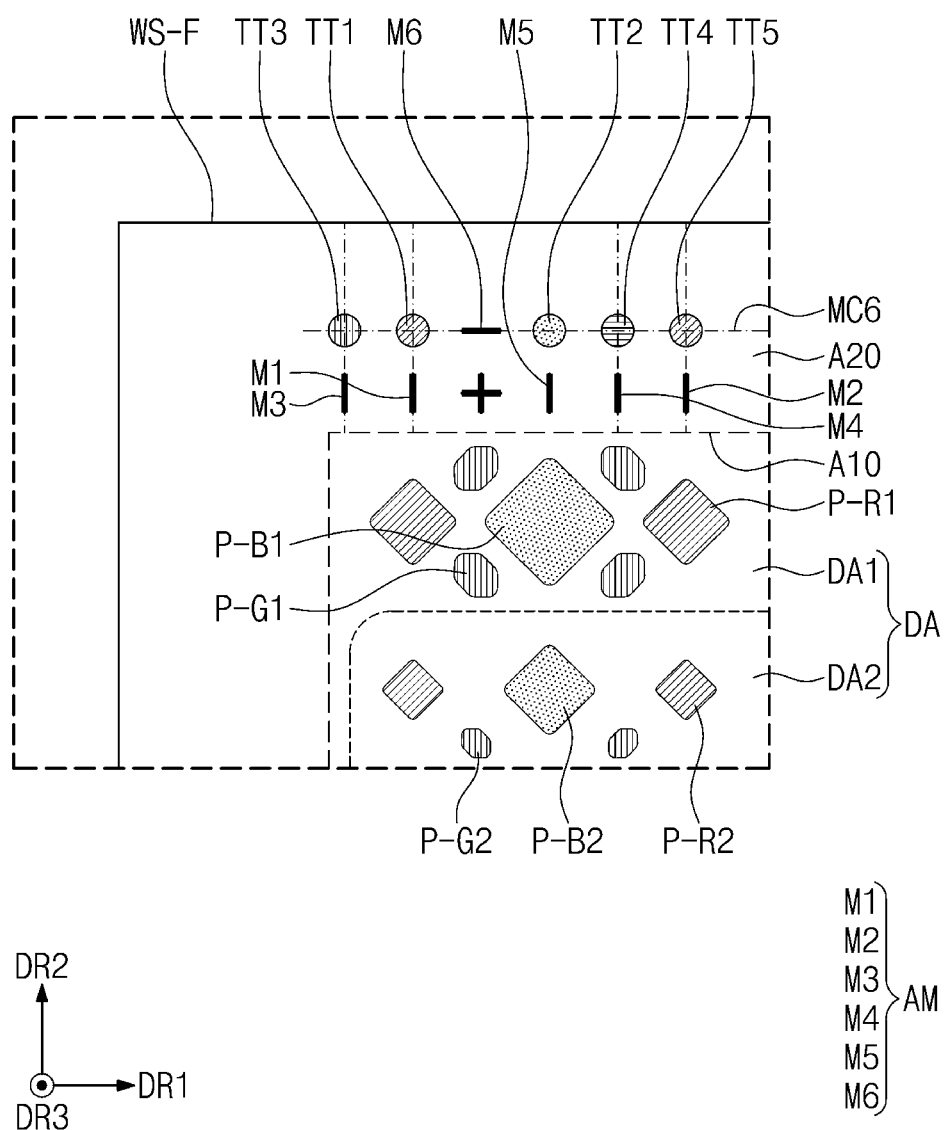
FIG. 15 is a partially enlarged plan view showing a target substrate after a deposition process according to an embodiment of the present disclosure.

FIG. 15 is a plan view showing the target substrate after the deposition process of the light emitting pattern according to an embodiment of the present disclosure. The light emitting patterns and the test thin films may be formed on a target substrate WS-F on which the deposition processes of the light emitting patterns are completed. From among the light emitting patterns, some light emitting patterns may overlap with each other, and other light emitting patterns may be formed to be spaced apart from each other. For example, as described above, the first light emitting pattern P-Ra and the second light emitting pattern P-Rb of FIG. 14C may be formed to overlap with each other, and may correspond to the first light emitting areas P-R1 and P-R2 shown in FIG. 15. The first light emitting pattern P-Rb corresponding to the first light emitting areas P-R1 and P-R2 and a third light emitting pattern corresponding to the second light emitting areas P-G1 and P-G2 may be formed to be spaced apart from each other. The light emitting patterns deposited on the target substrate WS-F may correspond to the light emitting areas P-R1, P-R2, P-G1, P-G2, P-B1, and P-B2 described above.

Test thin films TT1 to TT5 may be formed to be spaced apart from each other. The test thin films TT1 to TT5 may indicate the positions of the light emitting patterns formed on the target substrate WS-F. The first and second test thin films TT1 and TT2, which are formed to be spaced apart from each other, may be formed through the same or substantially the same process as those of the first and second test thin films TT1 and TT2 described above. Based on the positions of the test thin films TT1 to TT5, it may be checked whether or not the light emitting patterns are deposited at the accurate positions, and the position of each of the mask assemblies may be corrected as needed or desired.

The third light emitting pattern may be concurrently (e.g., simultaneously or substantially simultaneously) formed with the third test thin film TT3, and a fourth light emitting pattern may be concurrently (e.g., simultaneously or substantially simultaneously) formed with the fourth test thin film TT4. The third light emitting pattern and the fourth light emitting pattern may be the light emitting patterns formed to correspond to the second light emitting areas P-G1 and P-G2. The third light emitting pattern and the fourth light emitting pattern may be patterns that are sequentially stacked at (e.g., in or on) the same area as each other. A fifth light emitting pattern may be concurrently (e.g., simultaneously or substantially simultaneously) formed with the fifth test thin film TT5, and may be the light emitting pattern formed to correspond to the third light emitting areas P-B1 and P-B2.

For example, the first light emitting pattern and the second light emitting pattern may be the light emitting layers for emitting the red light, the third light emitting pattern and the fourth light emitting pattern may be the light emitting layers for emitting the green light, and the fifth light emitting pattern may be the light emitting layer for emitting the blue light, but the present disclosure is not limited thereto or thereby.

The mask according to one or more embodiments of the present disclosure may include the plurality of mark patterns, each of the mark patterns including at least one recess portion before being connected to (e.g., coupled to or attached to) the frame. The mark patterns may be the patterns on which the positions of the cell openings included in the mask are reflected. In the process of manufacturing the mask assembly, the hole may be formed through the mask to be adjacent to one mark pattern from among the mark patterns. According to one or more embodiments of the present disclosure, the mask assembly may be manufactured with selectively different hole positions using the same masks. The mask assemblies, each including the masks having the same cell opening positions and the different hole positions, may be used in the deposition process to form the light emitting patterns having the same shape, and may be used for the alignment correction to accurately align each mask assembly with the substrate. According to one or more embodiments of the present disclosure, the mask may be commonly used to form the light emitting patterns having the same shape, and the etching process used to manufacture the mask may be simplified, and thus, a manufacturing cost of the mask may be reduced.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A mask comprising:
a body portion comprising a cell area, and a peripheral area surrounding the cell area, the body portion having a plurality of cell openings defined therein; and
a plurality of mark patterns at the peripheral area,
wherein the cell area comprises:
a first area; and
a second area adjacent to the first area,
wherein the plurality of cell openings comprises:
first cell openings defined at the first area, and spaced from each other; and
second cell openings defined at the second area, and spaced from each other,
and wherein a shape of the second cell openings is different from a shape of the first cell openings, and
wherein each of the mark patterns comprises at least one recess portion, and has a point-symmetrical shape with respect to a corresponding symmetry point.

2. The mask of claim 1, wherein the recess portion is recessed from an upper surface or a lower surface of the body portion.

3. The mask of claim 1, wherein the mark patterns are connected to each other.

4. The mask of claim 1, wherein the recess portion comprises a plurality of recess portions, and the plurality of recess portions comprise:
a first recess portion;
a second recess portion spaced from the first recess portion;
a third recess portion that is symmetrical with the first recess portion with respect to the corresponding symmetry point; and
a fourth recess portion that is symmetrical with the second recess portion with respect to the corresponding symmetry point.

5. The mask of claim 4, wherein each of the recess portions has a polygonal shape in a plan view.

6. The mask of claim 1, wherein the recess portion overlaps with the corresponding symmetry point in a plan view.

7. The mask of claim 1, wherein the recess portion has a closed-curve shape surrounding the corresponding symmetry point in a plan view.

8. The mask of claim 1, wherein areas of the first cell openings are different from areas of the second cell openings in a plan view.

9. The mask of claim 1, wherein a distance between adjacent ones of the first cell openings is different from a distance between adjacent ones of the second cell openings in a plan view.

10. A mask assembly comprising:
a plurality of masks located along one direction; and
a frame underneath the plurality of masks,
wherein each of the masks comprises a body portion comprising a cell area, and a peripheral area surrounding the cell area, the body portion having a plurality of cell openings defined therein,
wherein at least one of the masks comprise:
a plurality of mark patterns at the peripheral area, and comprising at least one recess portion; and
a hole adjacent to a first mark pattern from among the mark patterns, and wherein each of the mark patterns has a point-symmetrical shape with respect to a corresponding symmetry point, and
wherein the symmetry point overlaps the hole.

11. The mask assembly of claim 10, wherein the cell area comprises a first area, and a second area adjacent to the first area, and
wherein the plurality of cell openings comprises:
first cell openings defined at the first area, and spaced from each other; and
second cell openings defined at the second area, and spaced from each other, the second cell openings being different from the first cell openings.

12. The mask assembly of claim 10, wherein the hole overlaps with the corresponding symmetry point in a plan view.

13. The mask assembly of claim 10, wherein the recess portion of the first mark pattern is spaced from the hole.

14. The mask assembly of claim 10, wherein the recess portion of the first mark pattern is connected integrally to the hole.

15. The mask assembly of claim 10, wherein an opening is defined in the frame, and the opening overlaps with the hole and the plurality of cell openings in a plan view.

* * * * *